(12) United States Patent
Fang

(10) Patent No.: US 12,272,565 B2
(45) Date of Patent: Apr. 8, 2025

(54) METHOD FOR PREPARING SEMICONDUCTOR STRUCTURE

(71) Applicant: NANYA TECHNOLOGY CORPORATION, New Taipei (TW)

(72) Inventor: Wei-Chuan Fang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 454 days.

(21) Appl. No.: 17/547,430

(22) Filed: Dec. 10, 2021

(65) Prior Publication Data

US 2023/0187220 A1 Jun. 15, 2023

(51) Int. Cl.
| | | |
|---|---|---|
| H01L 21/3213 | (2006.01) | |
| H01L 21/027 | (2006.01) | |
| H01L 21/033 | (2006.01) | |
| H01L 21/311 | (2006.01) | |
| H10B 12/00 | (2023.01) | |

(52) U.S. Cl.
CPC .... *H01L 21/32139* (2013.01); *H01L 21/0276* (2013.01); *H01L 21/0332* (2013.01); *H01L 21/0337* (2013.01); *H01L 21/31116* (2013.01); *H01L 21/31144* (2013.01); *H01L 21/32136* (2013.01); *H10B 12/485* (2023.02)

(58) Field of Classification Search
CPC .......... H01L 21/32139; H01L 21/0276; H01L 21/0332; H01L 21/0337; H01L 21/31116; H01L 21/31144; H01L 21/32136; H10B 12/485
See application file for complete search history.

(56) References Cited

U.S. PATENT DOCUMENTS

| | | | | |
|---|---|---|---|---|
| 5,674,356 | A * | 10/1997 | Nagayama | .......... H01L 21/0276 257/E21.252 |
| 10,147,608 | B1 * | 12/2018 | Shih | .................... H01L 21/0337 |
| 2007/0096188 | A1 * | 5/2007 | Maekawa | ......... H01L 21/76885 257/E21.507 |
| 2007/0261016 | A1 * | 11/2007 | Sandhu | ............... H01L 21/0338 257/E21.038 |
| 2010/0248434 | A1 * | 9/2010 | Jung | ................. H01L 21/32139 257/E21.632 |
| 2012/0044735 | A1 | 2/2012 | Tran et al. | |

(Continued)

OTHER PUBLICATIONS

Office Action and and the search report mailed on Jan. 29, 2024 related to Taiwanese Application No. 111109649.

*Primary Examiner* — Ratisha Mehta
*Assistant Examiner* — Brad A Knudson
(74) *Attorney, Agent, or Firm* — Xuan Zhang

(57) ABSTRACT

The present disclosure provides a method for preparing a semiconductor structure using the hardmask structure. The method includes forming a conductive layer on a substrate; forming a first ashable hardmask layer on the conductive layer; forming a first anti-reflection coating on the first ashable hardmask layer; forming a second ashable hardmask layer on the first anti-reflection coating, wherein a modulus of the first ashable hardmask layer is greater than a modulus of the second ashable hardmask layer; etching the first ashable hardmask layer, the first anti-reflection coating, and the second ashable hardmask layer to transfer a first pattern to at least the first ashable hardmask layer; and etching the conductive layer according to the first ashable hardmask layer to form a patterned conductive layer.

20 Claims, 17 Drawing Sheets

(56) References Cited

U.S. PATENT DOCUMENTS

| | | | |
|---|---|---|---|
| 2013/0256904 A1* | 10/2013 | Im | H10B 12/485 |
| | | | 257/E21.409 |
| 2013/0330932 A1* | 12/2013 | Rangarajan | H01L 21/022 |
| | | | 423/276 |
| 2016/0104619 A1* | 4/2016 | Chang | H01L 21/76802 |
| | | | 438/700 |
| 2016/0225636 A1* | 8/2016 | Kim | H01L 21/02318 |
| 2019/0304783 A1* | 10/2019 | Prasad | H01L 21/0337 |
| 2021/0391167 A1* | 12/2021 | Chiang | H01L 21/0274 |
| 2022/0181147 A1* | 6/2022 | Xue | H01J 37/32816 |
| 2022/0216037 A1* | 7/2022 | Weimer | H01J 37/32174 |
| 2022/0262643 A1* | 8/2022 | Nittala | H01L 21/324 |
| 2022/0406791 A1* | 12/2022 | Kim | H10B 12/34 |
| 2023/0039149 A1* | 2/2023 | Kim | H10B 12/485 |
| 2023/0223263 A1* | 7/2023 | Rigsby | H01L 21/0337 |
| | | | 438/694 |

* cited by examiner

METHOD FOR PREPARING SEMICONDUCTOR STRUCTURE

TECHNICAL FIELD

The present disclosure relates to a method for preparing a semiconductor structure, and more particularly, to a method for preparing a semiconductor structure using the hardmask structure.

DISCUSSION OF THE BACKGROUND

Hardmask structures are widely used in forming semiconductor structures. Wiggling of the patterned features/lines in semiconductor structures is undesired, especially for the feature sizes of semiconductor structures that are reduced to sub-100 nm scale. Therefore, issues of wiggling need to be resolved in order to obtain good feature/line patterns.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a hardmask structure. The hardmask structure includes a first ashable hardmask layer, a first anti-reflection coating, and a second ashable hardmask layer. The first anti-reflection coating is disposed on the first ashable hardmask layer. The second ashable hardmask layer is disposed on the first anti-reflection coating. A modulus of the first ashable hardmask layer is greater than a modulus of the second ashable hardmask layer.

Another aspect of the present disclosure provides a method for preparing a semiconductor structure. The method includes forming a conductive layer on a substrate and forming a first ashable hardmask layer on the conductive layer. The method also includes forming a first anti-reflection coating on the first ashable hardmask layer and forming a second ashable hardmask layer on the first anti-reflection coating, wherein a modulus of the first ashable hardmask layer is greater than a modulus of the second ashable hardmask layer. The method further includes etching the first ashable hardmask layer, the first anti-reflection coating, and the second ashable hardmask layer to transfer a first pattern to at least the first ashable hardmask layer. The method further includes etching the conductive layer according to the first ashable hardmask layer to form a patterned conductive layer.

Another aspect of the present disclosure provides a method for preparing a semiconductor structure. The method includes forming a conductive layer on a substrate and forming a hardmask structure on the conductive layer. The operation for forming the hardmask structure includes forming a first ashable hardmask layer on the conductive layer, the first ashable hardmask layer having a modulus of greater than about 130 GPa. The operation for forming the hardmask structure further includes forming a first anti-reflection coating on the first ashable hardmask layer. The method further includes removing a portion of the conductive layer according to the hardmask structure to form a patterned conductive layer.

The bottom ashable hardmask layer of the hardmask structure has a relatively high modulus can provide an excellent etching selectivity in the etching operation of a conductive layer underneath, and thus a predetermined pattern can be transferred to the patterned conductive layer more accurately and precisely. In addition, the bottom ashable hardmask layer having a relatively low compressive stress can further reduce wiggling issues of the patterned conductive layer. Moreover, the patterned conductive layer may serve as bit lines. With the line bending and/or wiggling issues of the bit lines are mitigated or prevented, the shapes and locations of the bit lines can be more accurate and precise, contact area between bit lines and adjacent contact structures can be increased, the resistance can be reduced, the signal transmission rate can be increased, and the electrical performance can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
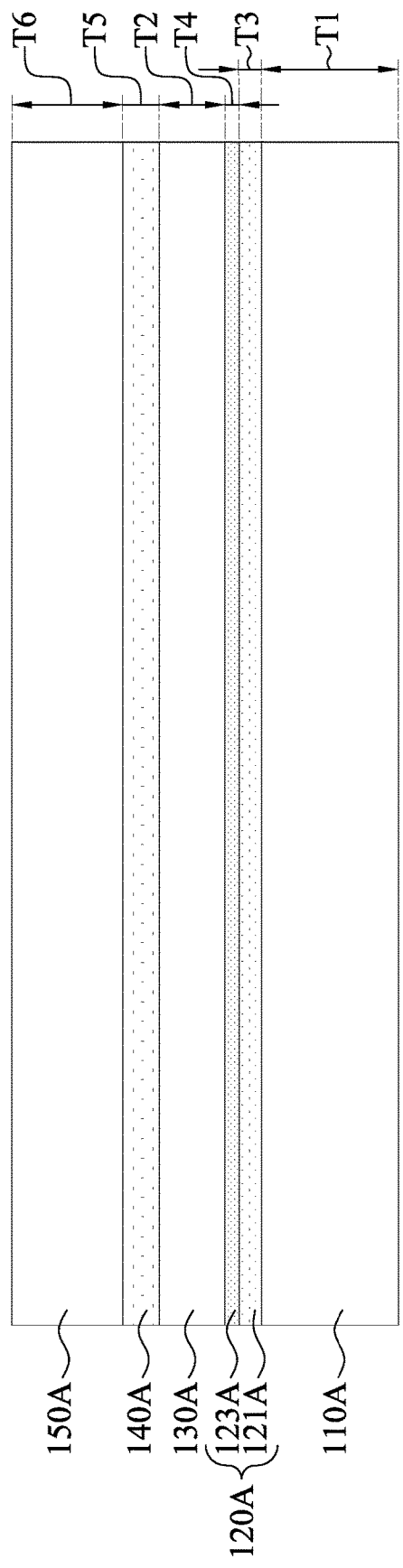
FIG. 1 illustrates a schematic view of a hardmask structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 illustrates a schematic view of a hardmask structure 10, in accordance with some embodiments of the present disclosure. The hardmask structure 10 includes ashable hardmask layers 110A and 130A, first anti-reflection coatings 120A and 140A, and a photoresist layer 150A.

The ashable hardmask layer 110A (also referred to as "the first ashable hardmask layer" or "the bottom ashable hardmask layer") may have a modulus that is greater than about 130 GPa. In some embodiments, the modulus of the ashable hardmask layer 110A is greater than about 150 GPa. In some embodiments, the modulus of the ashable hardmask layer 110A is greater than about 160 GPa. In some embodiments, the modulus of the ashable hardmask layer 110A is from about 140 GPa to about 170 GPa. In some embodiments, the modulus of the ashable hardmask layer 110A is from about 135 GPa to about 165 GPa.

In some embodiments, the ashable hardmask layer 110A has a compressive stress that is from about −120 MPa to about 70 MPa. In some embodiments, the compressive stress of the ashable hardmask layer 110A is from about −80 MPa to about 50 MPa. In some embodiments, the compressive stress of the ashable hardmask layer 110A is from about −70 MPa to about 20 MPa. In some embodiments, the compressive stress of the ashable hardmask layer 110A is from about −60 MPa to about 0 MPa. In some embodiments, the compressive stress of the ashable hardmask layer 110A is about −50 MPa.

In some embodiments, the ashable hardmask layer 110A has a density of greater than about 1.7 g/cm$^3$. In some embodiments, the density of the ashable hardmask layer 110A is greater than about 1.8 g/cm$^3$. In some embodiments, the density of the ashable hardmask layer 110A is greater than about 1.9 g/cm$^3$.

In some embodiments, the ashable hardmask layer 110A has a thickness T1 that is greater than a thickness T2 of the ashable hardmask layer 130A. In some embodiments, the thickness T1 of the ashable hardmask layer 110A is greater than about 60 nm. In some embodiments, the thickness T1 of the ashable hardmask layer 110A is equal to or greater than about 100 nm. In some embodiments, the thickness T1 of the ashable hardmask layer 110A is from about 100 nm to about 200 nm. In some embodiments, the thickness T1 of the ashable hardmask layer 110A is from about 130 nm to about 160 nm. In some embodiments, the thickness T1 of the ashable hardmask layer 110A is about 145 nm.

In some embodiments, the ashable hardmask layer 110A is more adjacent to a target layer to be patterned than the ashable hardmask layer 130A is, and the ashable hardmask layer 110A serves to transfer a predetermined pattern, which has a relatively small pitch, to the target layer. Therefore, in order to achieve a desired relatively large aspect ratio and a desired relatively small line width/line spacing of the target layer, the thickness T1 of the ashable hardmask layer 110A has the aforesaid ranges, so that the ashable hardmask layer 110A can be prevented from being completely consumed in the etching operation for the target layer.

In some embodiments, the ashable hardmask layer 110A includes a carbon-based material. In some embodiments, the ashable hardmask layer 110A includes amorphous carbon.

In some embodiments, the ashable hardmask layer 110A is implanted with carbon atoms. In some embodiments, an implant dosage concentration in the ashable hardmask layer 110A is from about $10^{14}$ to about $10^{16}$ ion/cm$^3$. In some embodiments, the implant dosage concentration in the ashable hardmask layer 110A may be $5 \times 10^{14}$ ion/cm$^3$, $1 \times 10^{15}$ ion/cm$^3$, or $5 \times 10^{15}$ ion/cm$^3$. In some embodiments, when the implant dosage concentration is smaller than $10^{14}$ ion/cm$^3$, the formation of sp$^3$ bonds in the ashable hardmask layer 110A may be insufficient to provide satisfactory mechanical properties (such as modulus) of the ashable hardmask layer 110A. In some embodiments, when the implant dosage concentration is greater than $10^{16}$ ion/cm$^3$, an excessive amount of sp³ bonds may be formed in the ashable hardmask layer 110A and increase the compression stress of the ashable hardmask layer 110A.

The anti-reflection coating 120A may be disposed on ashable hardmask layer 110A. In some embodiments, the anti-reflection coating 120A directly contacts the ashable hardmask layer 110A. In some embodiments, the anti-reflection coating 120A includes an inorganic material. In some embodiments, the anti-reflection coating 120A includes silicon oxynitride. In some embodiments, the anti-reflection coating 120A includes anti-reflection layers 121A and 123A.

In some embodiments, the anti-reflection layer 121A is disposed on the ashable hardmask layer 110A. In some embodiments, the anti-reflection layer 121A directly contacts the ashable hardmask layer 110A. In some embodiments, the anti-reflection layer 121A may be or include a silicon oxynitride layer. In some embodiments, the anti-reflection layer 121A may be or include an oxygen-rich silicon oxynitride layer. For example, an atomic ratio of silicon to oxygen (Si/O) of the anti-reflection layer 121A may be less than 1.

In some embodiments, the anti-reflection layer 123A is disposed on the anti-reflection layer 121A. In some embodiments, the anti-reflection layer 123A directly contacts the anti-reflection layer 121A. In some embodiments, the anti-reflection layer 123A may be or include a silicon oxynitride layer. In some embodiments, the anti-reflection layer 121A and the anti-reflection layer 123A have different silicon to oxygen (Si/O) ratios. In some embodiments, the anti-reflection layer 123A may be or include a silicon-rich silicon oxynitride layer. For example, an atomic ratio of silicon to oxygen (Si/O) of the anti-reflection layer 123A may be greater than 1.

In some embodiments, a thickness T4 of the anti-reflection layer 123A is less than a thickness T3 of the anti-reflection layer 121A. In some embodiments, the thickness T3 of the anti-reflection layer 121A is from 15 nm to about 25 nm. In some embodiments, the thickness T3 of the anti-reflection layer 121A is about 20 nm. In some embodiments, the thickness T4 of the anti-reflection layer 123A is from 5 nm to about 15 nm. In some embodiments, the thickness T4 of the anti-reflection layer 123A is about 10 nm.

In some embodiments, a sum of the thickness T3 of the anti-reflection layer 121A and the thickness T4 of the anti-reflection layer 123A is less than the thickness T1 of the ashable hardmask layer 110A. In some embodiments, a sum of the thickness T3 of the anti-reflection layer 121A and the thickness T4 of the anti-reflection layer 123A is less than the thickness T2 of the ashable hardmask layer 130A. In some embodiments, a sum of the thickness T3 of the anti-reflection layer 121A and the thickness T4 of the anti-reflection layer 123A is equal to or less than about 40 nm. In some embodiments, a sum of the thickness T3 of the anti-reflection layer 121A and the thickness T4 of the anti-reflection layer 123A is equal to or less than about 35 nm. In some embodiments, a sum of the thickness T3 of the anti-reflection layer 121A and the thickness T4 of the anti-reflection layer 123A is equal to or less than about 30 nm.

The ashable hardmask layer 130A may be disposed on the anti-reflection coating 120A. In some embodiments, the ashable hardmask layer 130A directly contacts the anti-reflection coating 120A. In some embodiments, the ashable hardmask layer 130A directly contacts the anti-reflection layer 123A. In some embodiments, the ashable hardmask layer 130A has a modulus that is less than the modulus of the ashable hardmask layer 110A. In some embodiments, the modulus of the ashable hardmask layer 130A is less than about 130 GPa.

In some embodiments, the ashable hardmask layer 130A has a tensile stress that is greater than a tensile stress of the ashable hardmask layer 110A. In some embodiments, the tensile stress of the ashable hardmask layer 130A is from about 75 GPa to about 231 GPa.

In some embodiments, the ashable hardmask layer 130A has a density that is smaller than a density of the ashable hardmask layer 110A. In some embodiments, the density of the ashable hardmask layer 130A is equal to or less than about 1.7 g/cm³. In some embodiments, the density of the ashable hardmask layer 130A is from about 1.5 g/cm³ to about 1.7 g/cm³.

In some embodiments, the thickness T2 of the ashable hardmask layer 130A is less than the thickness T1 of the ashable hardmask layer 110A. In some embodiments, the thickness T2 of the ashable hardmask layer 130A is equal to or less than about 60 nm.

In some embodiments, the ashable hardmask layer 130A serves to transfer an initial pattern from a patterned photoresist to the anti-reflection coating 140A underneath, and thus the thickness T2 of the ashable hardmask layer 130A may be relatively thin.

In some embodiments, the ashable hardmask layer 130A includes a carbon-based material. In some embodiments, the ashable hardmask layer 130A includes amorphous carbon.

In some embodiments, the ashable hardmask layer 130A is implanted with carbon atoms. In some embodiments, an implant dosage concentration in the ashable hardmask layer 130A is from about $10^{14}$ to about $10^{16}$ ion/cm³. In some embodiments, the implant dosage concentration in the ashable hardmask layer 130A may be $5\times10^{14}$ ion/cm³, $1\times10^{15}$ ion/cm³, or $5\times10^{15}$ ion/cm³. In some embodiments, when the implant dosage concentration is smaller than $10^{14}$ ion/cm³, the formation of sp³ bonds in the ashable hardmask layer 130A may be insufficient to provide satisfactory mechanical properties (such as modulus) of the ashable hardmask layer 130A. In some embodiments, when the implant dosage concentration is greater than $10^{16}$ ion/cm³, an excessive amount of sp³ bonds may be formed in the ashable hardmask layer 130A and increase the compression stress of the ashable hardmask layer 130A.

The anti-reflection coating 140A may be disposed on the ashable hardmask layer 130A. In some embodiments, the anti-reflection coating 140A directly contacts the ashable hardmask layer 130A. In some embodiments, the anti-reflection coating 140A may be or include a silicon oxynitride layer. In some embodiments, the anti-reflection coating 140A may be or include an oxygen-rich silicon oxynitride layer. For example, an atomic ratio of silicon to oxygen (Si/O) of the anti-reflection coating 140A may be less than 1.

In some embodiments, a thickness T5 of the anti-reflection coating 140A is less than a thickness of the anti-reflection coating 120A. In some embodiments, a thickness T5 of the anti-reflection coating 140A is less than a sum of the thickness T3 of the anti-reflection layer 121A and the thickness T4 of the anti-reflection layer 123A. In some embodiments, the thickness T5 of the anti-reflection coating 140A is from 20 nm to about 30 nm. In some embodiments, the thickness T5 of the anti-reflection coating 140A is about 25 nm.

The photoresist layer 150A may be disposed on the ashable hardmask layer 130A. In some embodiments, the photoresist layer 150A is disposed on the anti-reflection coating 140A. In some embodiments, the photoresist layer 150A directly contacts the anti-reflection coating 140A. The photoresist layer 150A may be or include a polymeric material.

In some embodiments, a thickness T6 of the photoresist layer 150A may be greater than the thickness T5 of the anti-reflection coating 140A. In some embodiments, a thickness T6 of the photoresist layer 150A may be greater than a thickness of the anti-reflection coating 120A. In some embodiments, a thickness T6 of the photoresist layer 150A may be greater than a sum of the thickness T3 of the anti-reflection layer 121A and the thickness T4 of the anti-reflection layer 123A. In some embodiments, the thickness T6 of the photoresist layer 150A is from 80 nm to about 120 nm. In some embodiments, the thickness T6 of the photoresist layer 150A is about 100 nm.

In some embodiments, the hardmask structure 10 is free of an amorphous silicon layer. In some embodiments, the hardmask structure 10 is free of an organic hardmask layer. In some embodiments, the hardmask structure 10 is free of a silicon nitride layer between the ashable hardmask layer 110A and the photoresist layer 150A. In some embodiments, the hardmask structure 10 is free of a silicon nitride layer between the ashable hardmask layer 110A and the ashable hardmask layer 130A.

According to some embodiments of the present disclosure, the ashable hardmask layer 110A (or the bottom ashable hardmask layer) may be adjacent to a target layer to be patterned, thus the ashable hardmask layer 110A having the aforesaid relatively high modulus can provide an excellent etching selectivity in the etching operation of the target layer, and the ashable hardmask layer 110A having the aforesaid relatively low compressive stress can further reduce wiggling issues of the patterned target layer.

Moreover, according to some embodiments of the present disclosure, instead of incorporating one or more organic hardmask layers, the anti-reflection coatings 120A and 140A which include one or more inorganic materials and may be formed by PECVD, and thus the anti-reflection coatings 120A and 140A each has a relatively high hardness and a relatively small thickness. Therefore, the anti-reflection coatings 120A and 140A are advantageous to increasing the etching selectivity while reducing the overall thickness of the hardmask structure 10. Therefore, with the reduced overall thickness of the hardmask structure 10, etching loading can be further reduced.

Moreover, according to some embodiments of the present disclosure, the anti-reflection layer 123A including a silicon-rich silicon oxynitride layer is disposed on the anti-reflection layer 121A including an oxygen-rich silicon oxynitride layer. Therefore, the silicon-rich silicon oxynitride layer having a relatively high hardness can further increase the etching selectivity and provide a uniform etching effect. In addition, the oxygen-rich silicon oxynitride layer may be removed more easily, e.g., by HF or diluted HF, and thus the silicon-rich silicon oxynitride layer may be easily removed along with the removal of the oxygen-rich silicon oxynitride layer, which may simplify the manufacturing process. In summary, according to some embodiments of the present disclosure, with the aforesaid arrangements of the anti-reflection layers 121A and 123A, the etching selectivity can be increased, the etching uniformity can be increased, and the manufacturing process can be simplified.

Furthermore, according to some embodiments of the present disclosure, the anti-reflection coating 140A can reduce reflection or refraction of lights in a photolithography process for patterning the photoresist layer 150A. Therefore, the alignment accuracy can be increased, the pattern transferring operation can be performed more precisely, and thus the line width/line spacing of the transferred pattern can be further reduced.

Figure 1A:
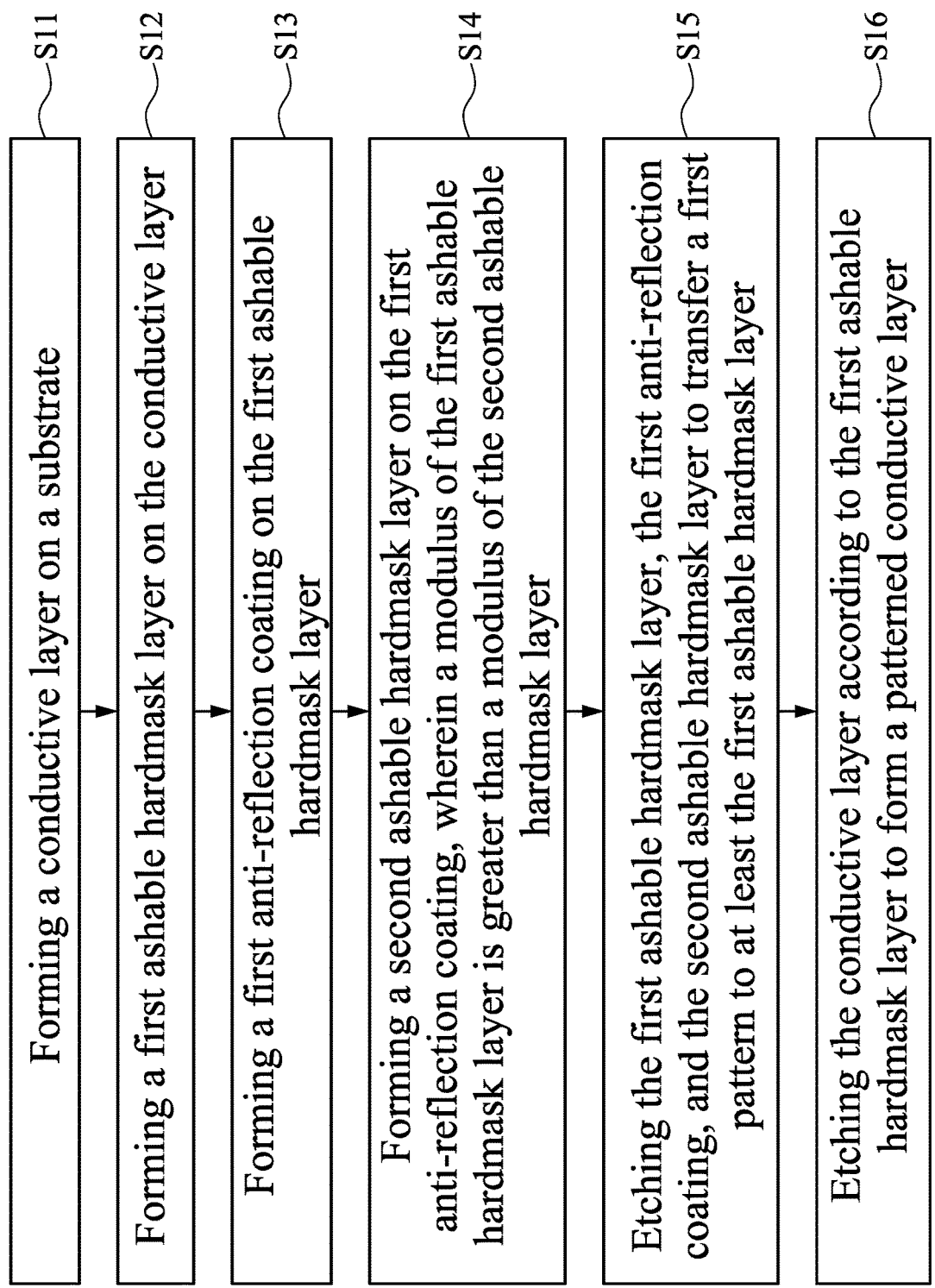
FIG. 1A is a flow chart illustrating a method for preparing a semiconductor structure, in accordance with some embodiments of the present disclosure.

FIG. 1A is a flow chart illustrating a method 1A of forming a semiconductor structure, in accordance with some embodiments of the present disclosure.

The method 1A begins with operation S11 in which a conductive layer is formed on a substrate.

The method 1A continues with operation S12 in which a first ashable hardmask layer is formed on the conductive layer.

The method 1A continues with operation S13 in which a first anti-reflection coating is formed on the first ashable hardmask layer.

The method 1A continues with operation S14 in which a second ashable hardmask layer is formed on the first anti-reflection coating. A modulus of the first ashable hardmask layer is greater than a modulus of the second ashable hardmask layer.

The method 1A continues with operation S15 in which the first ashable hardmask layer, the first anti-reflection coating, and the second ashable hardmask layer are etched to transfer a first pattern to at least the first ashable hardmask layer.

The method 1A continues with operation S16 in which the conductive layer is etched according to the first ashable hardmask layer to form a patterned conductive layer.

The method 1A is merely an example, and is not intended to limit the present disclosure beyond what is explicitly recited in the claims. Additional operations can be provided before, during, or after each operations of the method 1A, and some operations described can be replaced, eliminated, or moved around for additional embodiments of the method. In some embodiments, the method 1A can include further operations not depicted in FIG. 1A. In some embodiments, the method 1A can include merely one or several operations depicted in FIG. 1A.

Figure 1B:
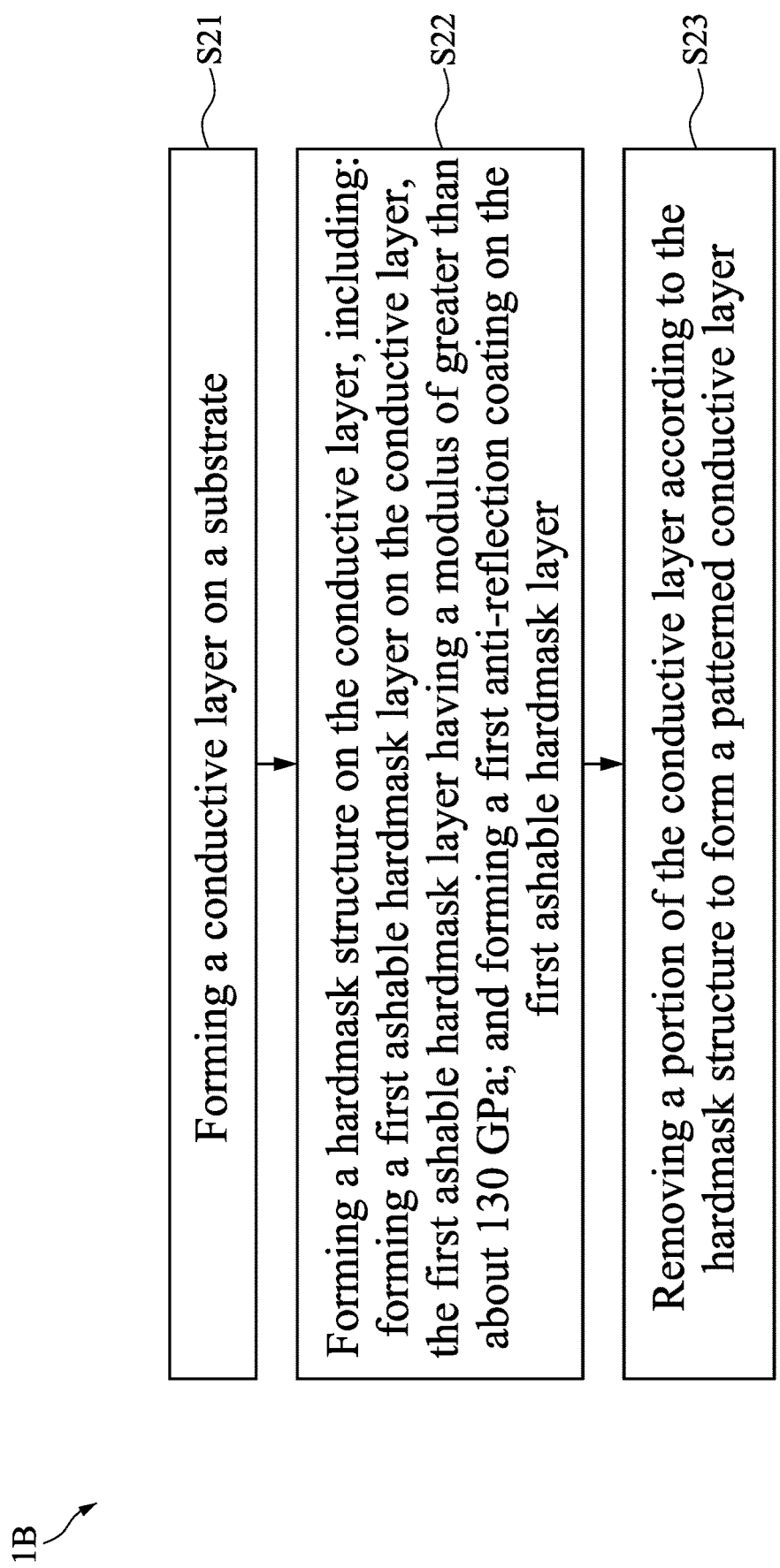
FIG. 1B is a flow chart illustrating a method for preparing a semiconductor structure, in accordance with some embodiments of the present disclosure.

FIG. 1B is a flow chart illustrating a method 1B of forming a semiconductor structure, in accordance with some embodiments of the present disclosure.

The method 1B begins with operation S21 in which a conductive layer is formed on a substrate.

The method 1B continues with operation S22 in which a hardmask structure is formed on the conductive layer. The operation S22 includes forming a first ashable hardmask layer on the conductive layer. The first ashable hardmask layer has a modulus of greater than about 130 GPa. The operation S22 further includes forming a first anti-reflection coating on the first ashable hardmask layer.

The method 1B continues with operation S22 in which a portion of the conductive layer is removed according to the hardmask structure to form a patterned conductive layer.

The method 1B is merely an example, and is not intended to limit the present disclosure beyond what is explicitly recited in the claims. Additional operations can be provided before, during, or after each operations of the method 1B, and some operations described can be replaced, eliminated, or moved around for additional embodiments of the method. In some embodiments, the method 1B can include further operations not depicted in FIG. 1B. In some embodiments, the method 1B can include merely one or several operations depicted in FIG. 1B.

Figure 8:
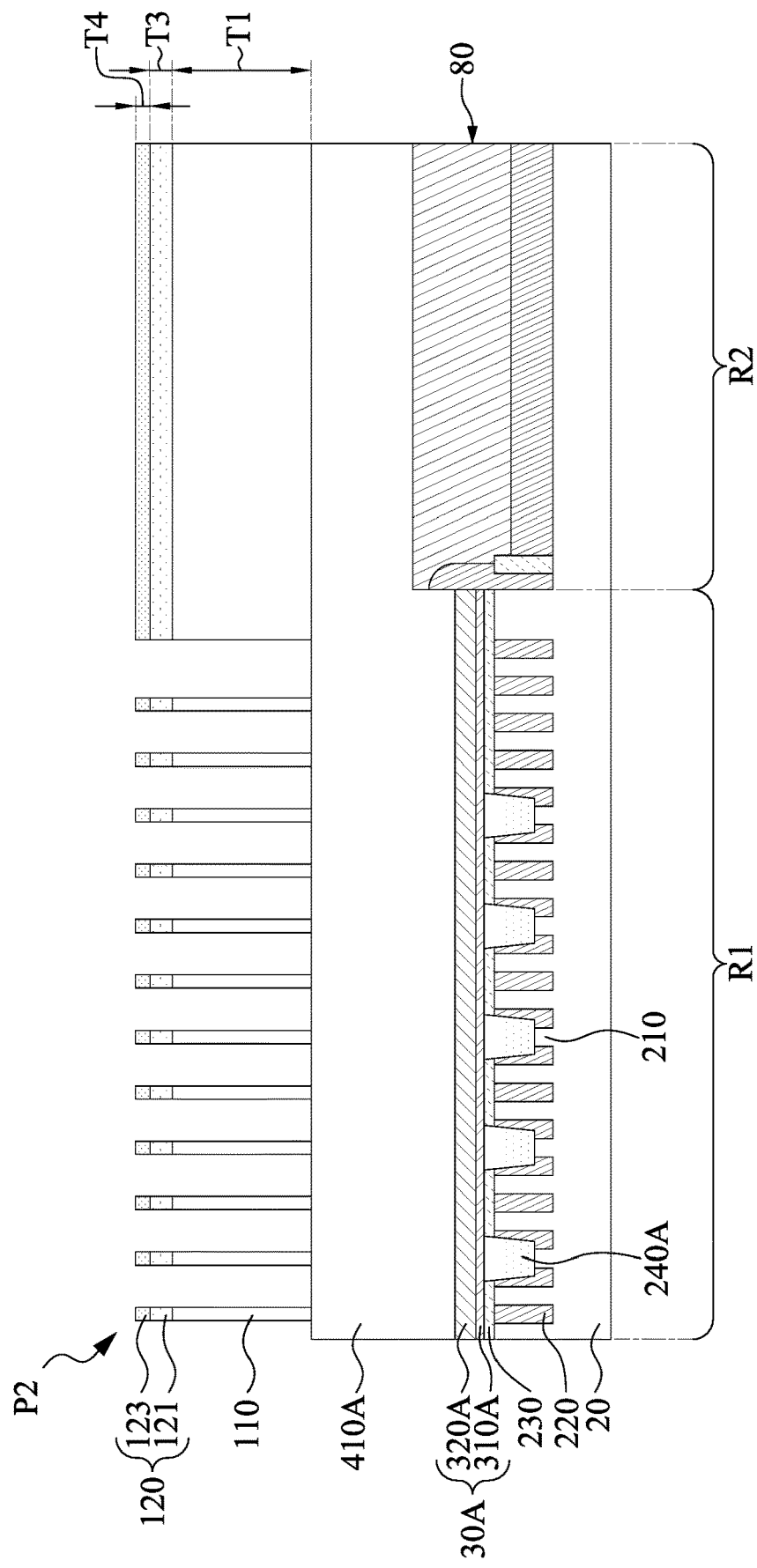
FIG. 8 illustrates one stage of a method for preparing a semiconductor structure, in accordance with some embodiments of the present disclosure.
Figure 9:
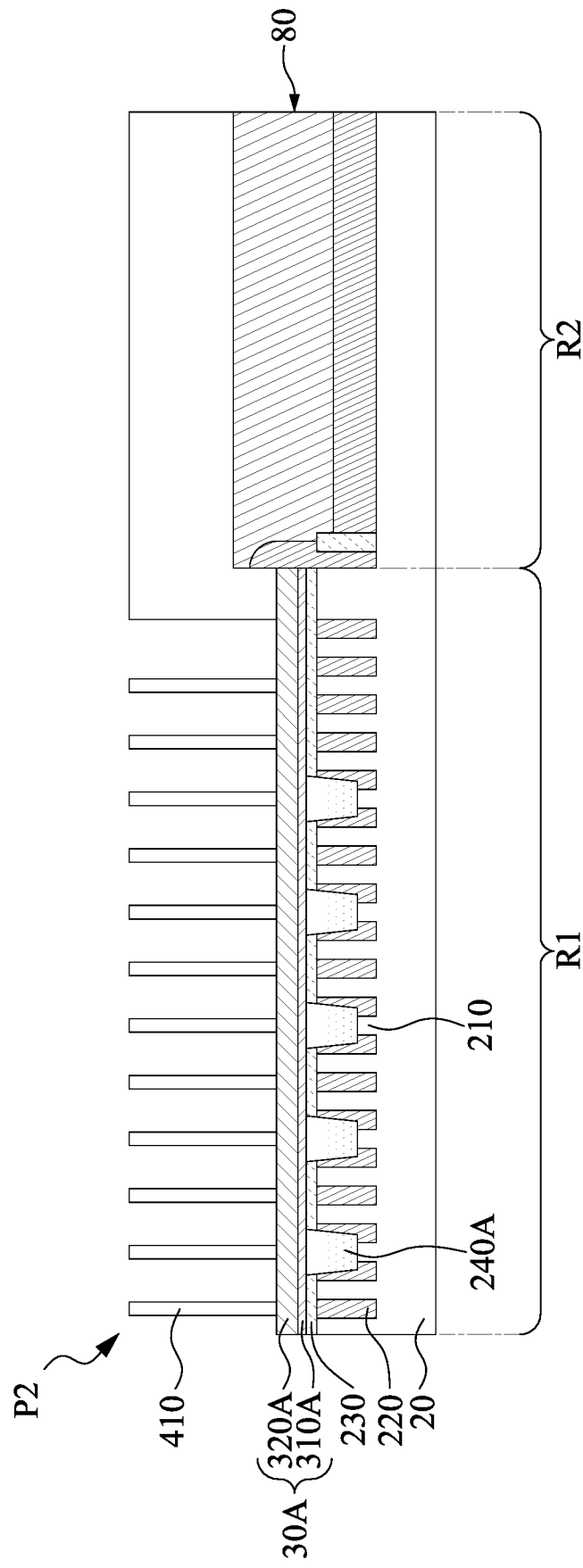
FIG. 9 illustrates one stage of a method for preparing a semiconductor structure, in accordance with some embodiments of the present disclosure.
Figure 10:
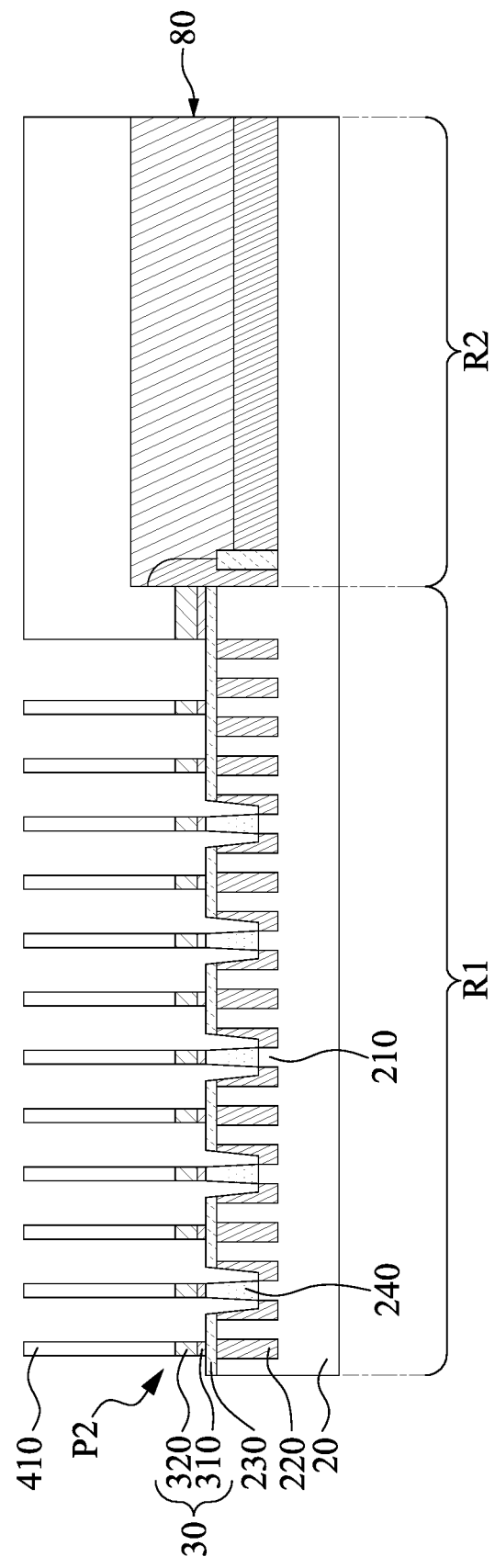
FIG. 10 illustrates one stage of a method for preparing a semiconductor structure, in accordance with some embodiments of the present disclosure.

FIG. 2A to FIG. 10 illustrate various stages of a method for preparing a semiconductor structure 1 (details of which are shown in FIG. 10), in accordance with some embodiments of the present disclosure.

Figure 2A:
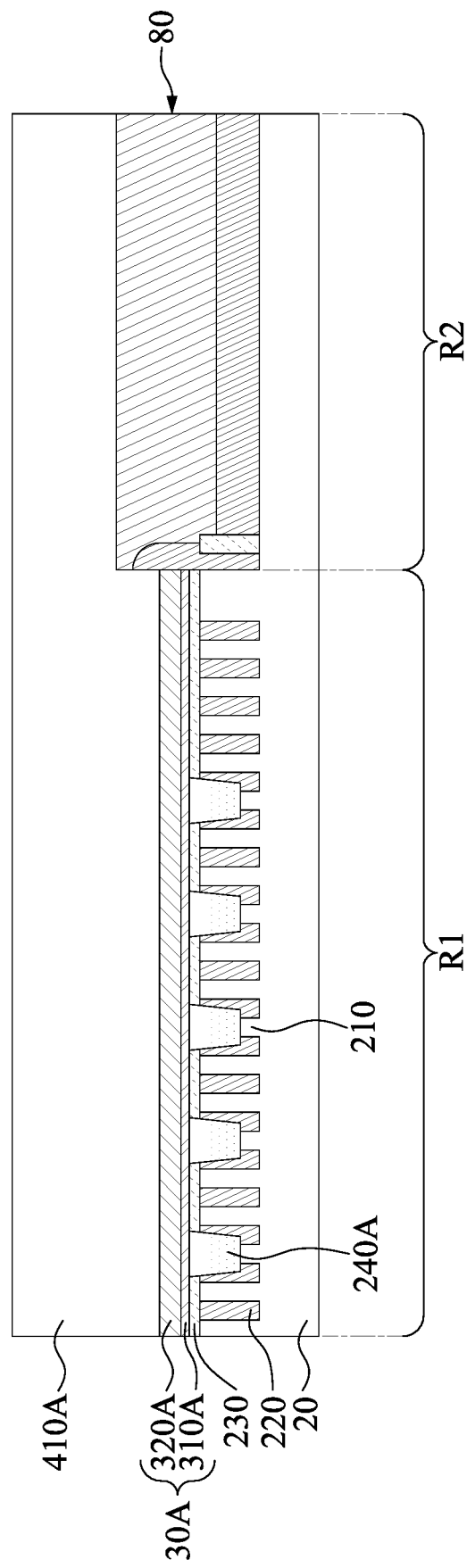
FIG. 2A illustrates one stage of a method for preparing a semiconductor structure, in accordance with some embodiments of the present disclosure.

Referring to FIG. 2A, which illustrates one stage of a method for preparing a semiconductor structure 1, in accordance with some embodiments of the present disclosure. A substrate 20 may be provided. The substrate 20 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. In some embodiments, the substrate 20 includes an array region R1 and a peripheral region R2.

Still referring to FIG. 2A, an isolation layer 220 may be formed in the substrate 20, and a plurality of active regions of the substrate 20 may be defined by the isolation layer 220. A photolithography process may be performed to pattern the substrate 20 to define positions of the plurality of active regions. An etch process may be performed after the photolithography process to form a plurality of trenches in the substrate 20. After the etch process, an insulating material such as silicon oxide, silicon nitride, silicon oxynitride, silicon nitride oxide, or fluoride-doped silicate, may be used to fill the plurality of trenches by a deposition process. A planarization process, such as chemical mechanical polishing, may be performed after the deposition process to remove excess material and provide a substantially flat surface for subsequent processing steps and conformally form the isolation layer 220 and the plurality of active regions.

Still referring to FIG. 2A, a plurality of doped regions 210 may be formed in the active regions. The doped regions 210 may be formed by an implantation process using dopant such as phosphorus, arsenic, or antimony. The doped regions 210 may respectively have a dopant concentration ranging from about $10^{17}$ atoms/cm$^3$ to about $10^{19}$ atoms/cm$^3$. The doped regions 210 may serve as source/drain regions.

Still referring to FIG. 2A, a buffer layer 230 may be formed on the substrate 20. The buffer layer 230 may be formed as a stacked layer or a single layer including silicon oxide, silicon nitride, silicon oxynitride, silicon nitride oxide, fluoride-doped silicate, or the like.

Still referring to FIG. 2A, a plurality of conductive portions 240A may be formed in the buffer layer 230 and contacting the doped regions 210 and the isolation layer 220 of the substrate 20. A plurality of openings may be formed in the buffer layer 230 and extending into portions of the doped regions 210 and the isolation layer 220 of the substrate 20. A photolithography process may be performed to pattern the buffer layer 230 and portions of the isolation layer 220 of the substrate 20 to define the positions of the openings. An etch process may be performed after the photolithography process to form the openings in the buffer layer 230 and extending into portions of the doped regions 210 and the isolation layer 220 of the substrate 20.

Still referring to FIG. 2A, the plurality of conductive portions 240A may be respectively correspondingly formed in the openings. In the embodiment, a conductive material, for example, doped polysilicon, a metal, or a metal silicide may be deposited into the openings by a metallization process. After the metallization process, a planarization process, such as chemical mechanical polishing, may be performed to remove excess material, provide a substantially flat surface for subsequent processing steps, and conformally form the plurality of conductive portions 240A. The plurality of conductive portions 240A may be electrically connected to center portions of the some of the doped regions 210. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. In some embodiments, the conductive portions 240A may serve as bit line contacts.

Still referring to FIG. 2A, a conductive layer 30A may be formed on the substrate 20. In some embodiments, a series of deposition processes may be performed to sequentially deposit a conductive sub-layer 310A and conductive sub-layer 320A on the buffer layer 230 and the plurality of conductive portions 240A. The conductive sub-layer 310A may be formed on the buffer layer 230 and the plurality of conductive portions 240A. The conductive sub-layer 320A may be formed on the conductive sub-layer 310A. The conductive sub-layer 310A may be formed of, for example, polysilicon or titanium nitride. The conductive sub-layer 320A may be formed of, for example, copper, nickel, cobalt, aluminum, or tungsten. In some embodiments, the conductive portions 240A are under the conductive layer 30A. In some embodiments, the conductive layer 30A (e.g., the conductive sub-layers 310A and 320A) are bit line layers. In some embodiments, the conductive layer 30A is formed on the array region R1 of the substrate 20.

Still referring to FIG. 2A, a dielectric structure 80 may be formed on the substrate 20 on the peripheral region R2, and a nitride layer 410A may be formed on the conductive layer 30A and the dielectric structure 80. In some embodiments, the nitride layer 410A cover the array region R1 and the peripheral region R2. In some embodiments, the nitride layer 410 may be or include a silicon nitride layer.

Figure 2B:
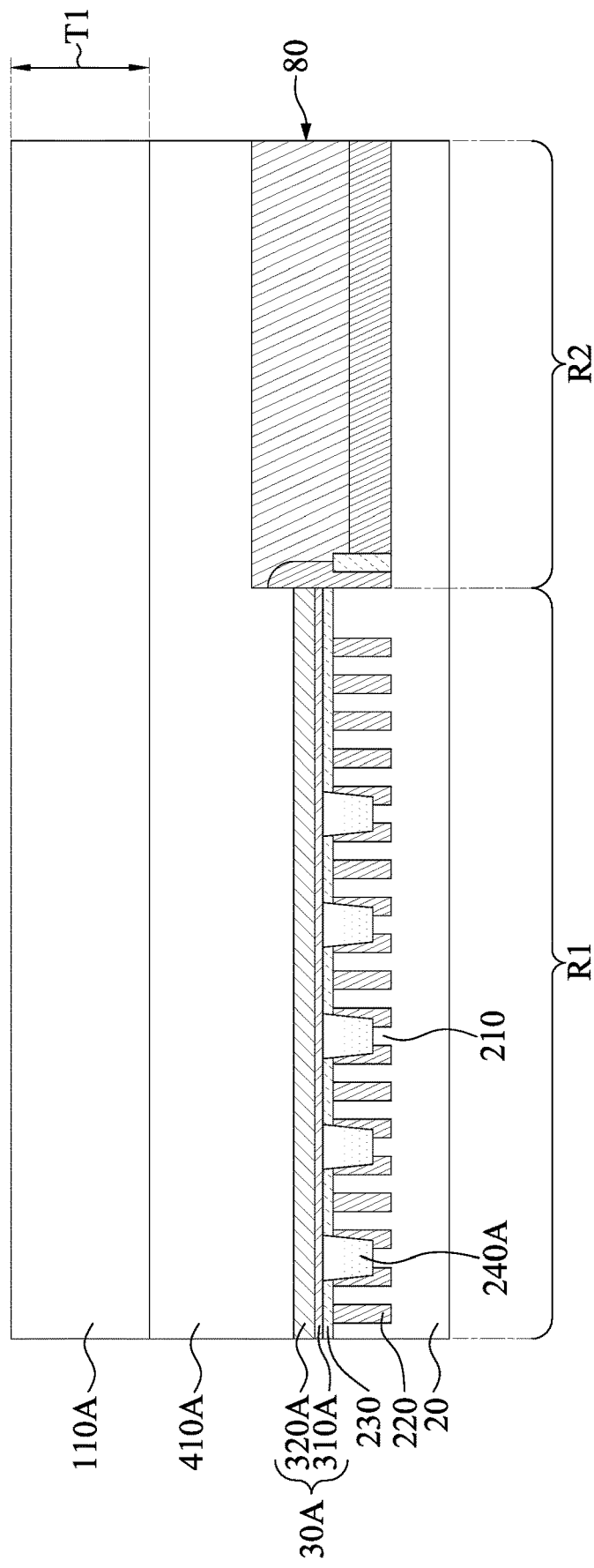
FIG. 2B illustrates one stage of a method for preparing a semiconductor structure, in accordance with some embodiments of the present disclosure.

Referring to FIG. 2B, which illustrates one stage of a method for preparing a semiconductor structure 1, in accordance with some embodiments of the present disclosure. An ashable hardmask layer 110A may be formed over the conductive layer 30A.

In some embodiments, an initial hardmask layer for the ashable hardmask layer 110A is formed on the nitride layer 410A by a deposition process, e.g., a plasma-enhanced chemical vapor deposition (PECVD) process. In some embodiments, the nitride layer 410A is exposed to a precursor gas including a $C_xH_y$-based gas, in which x is an integer of 2-6, y is an integer of 2-14, such as $C_2H_2$, $C_3H_6$, $C_4H_{10}$, $C_6H_6$, or a combination thereof. In some embodiments, the precursor gas is diluted by a bulk gas such as $N_2$, He, Ar, or a combination thereof. In some embodiments, the initial hardmask layer includes a carbon-based material, such as amorphous carbon.

In some embodiments, the initial hardmask layer for the ashable hardmask layer 110A is formed under a processing temperature (e.g., the deposition temperature) of higher than about 550° C. In some embodiments, the processing temperature of the initial hardmask layer is from about 560° C. to about 700° C. In some embodiments, the processing temperature of the initial hardmask layer is from about 600° C. to about 640° C. In some embodiments, the processing temperature of the initial hardmask layer is from about 620° C. to about 630° C.

Next, still referring to FIG. 2B, the initial mask layer for the ashable hardmask layer 110A is implanted with carbon atoms under an implantation temperature of higher than about 550° C. to form the ashable hardmask layer 110A. In some embodiments, the implantation temperature is from about 560° C. to about 700° C. In some embodiments, the implantation temperature is from about 600° C. to about 640° C. In some embodiments, the implantation temperature is from about 620° C. to about 630° C. If the implantation temperature is lower than 550° C., the degree of crystallinity of the ashable hardmask layer 110A after implantation is low, thereby affecting the film quality and resulting in failing to reduce compressive stress to a predetermined value (details discussed hereinafter) and increase the modulus to a predetermined value (details discussed hereinafter). If the implantation temperature is greater than 700° C., excessive sp$^3$ bonds may form in the ashable hardmask layer 110A after implantation, which will also increase the compressive stress.

In some embodiments, an implant dosage concentration in the ashable hardmask layer 110A is from about $10^{14}$ to about $10^{16}$ ion/cm$^3$. In some embodiments, the implant dosage concentration in the ashable hardmask layer 110A may be $5 \times 10^{14}$ ion/cm$^3$, $1 \times 10^{15}$ ion/cm$^3$, or $5 \times 10^{15}$ ion/cm$^3$. In some embodiments, when the implant dosage concentration is smaller than $10^{14}$ ion/cm$^3$, the formation of sp$^3$ bonds in the ashable hardmask layer 110A may be insufficient to provide satisfactory mechanical properties (such as modulus) of the ashable hardmask layer 110A. In some embodiments, when the implant dosage concentration is greater than $10^{16}$ ion/cm$^3$, an excessive amount of sp$^3$ bonds may be formed in the ashable hardmask layer 110A and increase the compression stress of the ashable hardmask layer 110A.

In some embodiments, the as-formed ashable hardmask layer 110A has a modulus that is greater than about 130 GPa. In some embodiments, the modulus of the ashable hardmask layer 110A is greater than about 150 GPa. In some embodiments, the modulus of the ashable hardmask layer 110A is greater than about 160 GPa. In some embodiments, the modulus of the ashable hardmask layer 110A is from about 140 GPa to about 170 GPa. In some embodiments, the modulus of the ashable hardmask layer 110A is from about 135 GPa to about 165 GPa.

In some embodiments, the ashable hardmask layer 110A has a compressive stress that is from about −120 MPa to about 70 MPa. In some embodiments, the compressive stress of the ashable hardmask layer 110A is from about −80 MPa to about 50 MPa. In some embodiments, the compressive stress of the ashable hardmask layer 110A is from about −70 MPa to about 20 MPa. In some embodiments, the compressive stress of the ashable hardmask layer 110A is from about −60 MPa to about 0 MPa. In some embodiments, the compressive stress of the ashable hardmask layer 110A is about −50 MPa.

In some embodiments, the ashable hardmask layer 110A has a density of greater than about 1.7 g/cm$^3$. In some embodiments, the density of the ashable hardmask layer 110A is greater than about 1.8 g/cm$^3$. In some embodiments, the density of the ashable hardmask layer 110A is greater than about 1.9 g/cm$^3$.

In some embodiments, the ashable hardmask layer 110A has a thickness T1 that is greater than a thickness T2 of the ashable hardmask layer 130A. In some embodiments, the thickness T1 of the ashable hardmask layer 110A is greater than about 60 nm. In some embodiments, the thickness T1 of the ashable hardmask layer 110A is equal to or greater than about 100 nm. In some embodiments, the thickness T1 of the ashable hardmask layer 110A is from about 100 nm to about 200 nm. In some embodiments, the thickness T1 of the ashable hardmask layer 110A is from about 130 nm to about 160 nm. In some embodiments, the thickness T1 of the ashable hardmask layer 110A is about 145 nm.

Figure 2C:
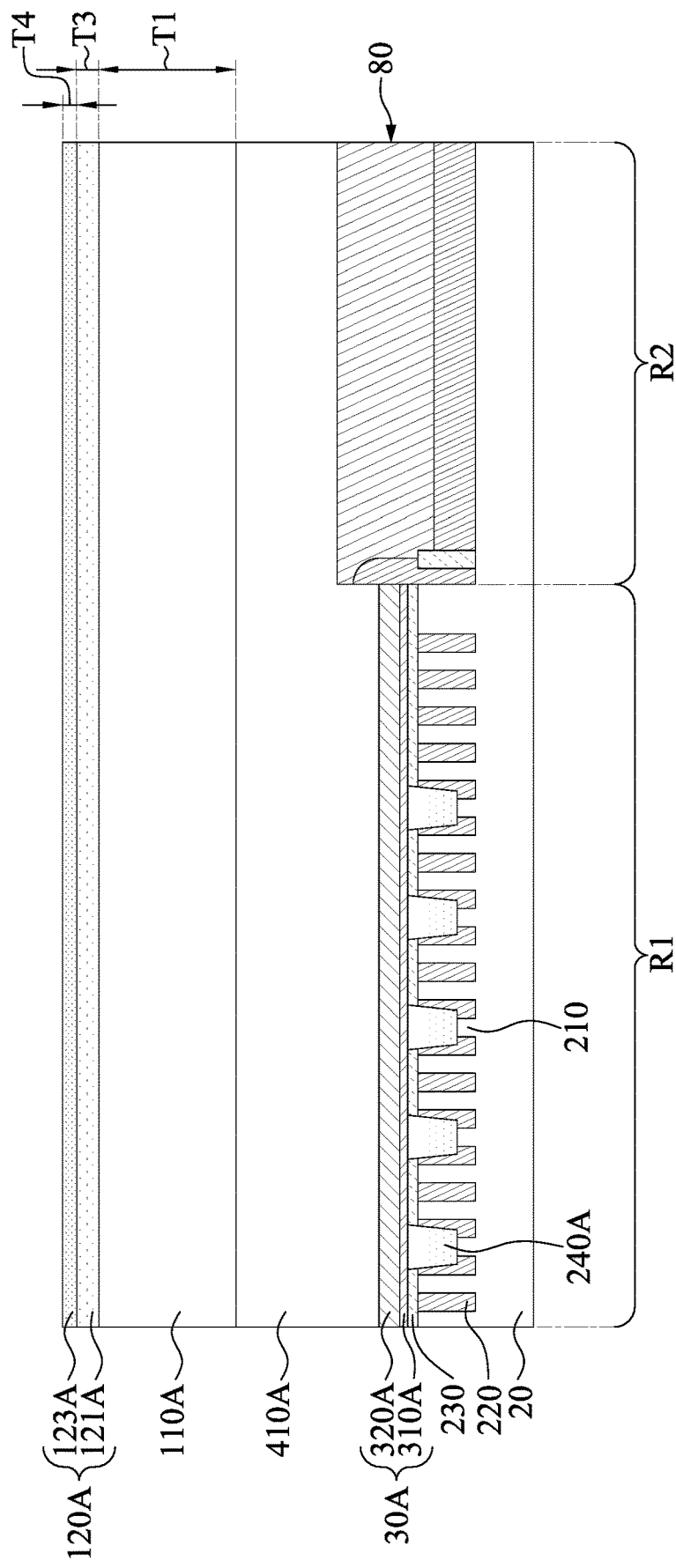
FIG. 2C illustrates one stage of a method for preparing a semiconductor structure, in accordance with some embodiments of the present disclosure.

Referring to FIG. 2C, which illustrates one stage of a method for preparing a semiconductor structure 1, in accordance with some embodiments of the present disclosure. An anti-reflection coating 120A may be formed on the ashable hardmask layer 110A. In some embodiments, the anti-reflection coating 120A includes anti-reflection layers 121A and 123A.

In some embodiments, an anti-reflection layer 121A is formed on the ashable hardmask layer 110A, and an anti-reflection layer 123A is formed on the anti-reflection layer 121A. In some embodiments, the anti-reflection layers 121A and 123A include one or more inorganic materials. In some embodiments, the anti-reflection layers 121A and 123A each includes a silicon oxynitride layer. In some embodiments, the anti-reflection layers 121A and 123A have different silicon to oxygen (Si/O) ratios. In some embodiments, the anti-reflection layer 121A may be or include an oxygen-rich silicon oxynitride layer. For example, an atomic ratio of silicon to oxygen (Si/O) of the anti-reflection layer 121A may be less than 1. In some embodiments, the anti-reflection layer 123A may be or include a silicon-rich silicon oxynitride layer. For example, an atomic ratio of silicon to oxygen (Si/O) of the anti-reflection layer 123A may be greater than 1.

In some embodiments, the anti-reflection layers 121A and 123A each may be formed by a deposition process, e.g., a plasma-enhanced chemical vapor deposition (PECVD) process. In some embodiments, a thickness T4 of the anti-reflection layer 123A is less than a thickness T3 of the anti-reflection layer 121A. In some embodiments, the thickness T3 of the anti-reflection layer 121A is from 15 nm to about 25 nm. In some embodiments, the thickness T3 of the anti-reflection layer 121A is about 20 nm. In some embodiments, the thickness T4 of the anti-reflection layer 123A is from 5 nm to about 15 nm. In some embodiments, the thickness T4 of the anti-reflection layer 123A is about 10 nm.

Figure 2D:
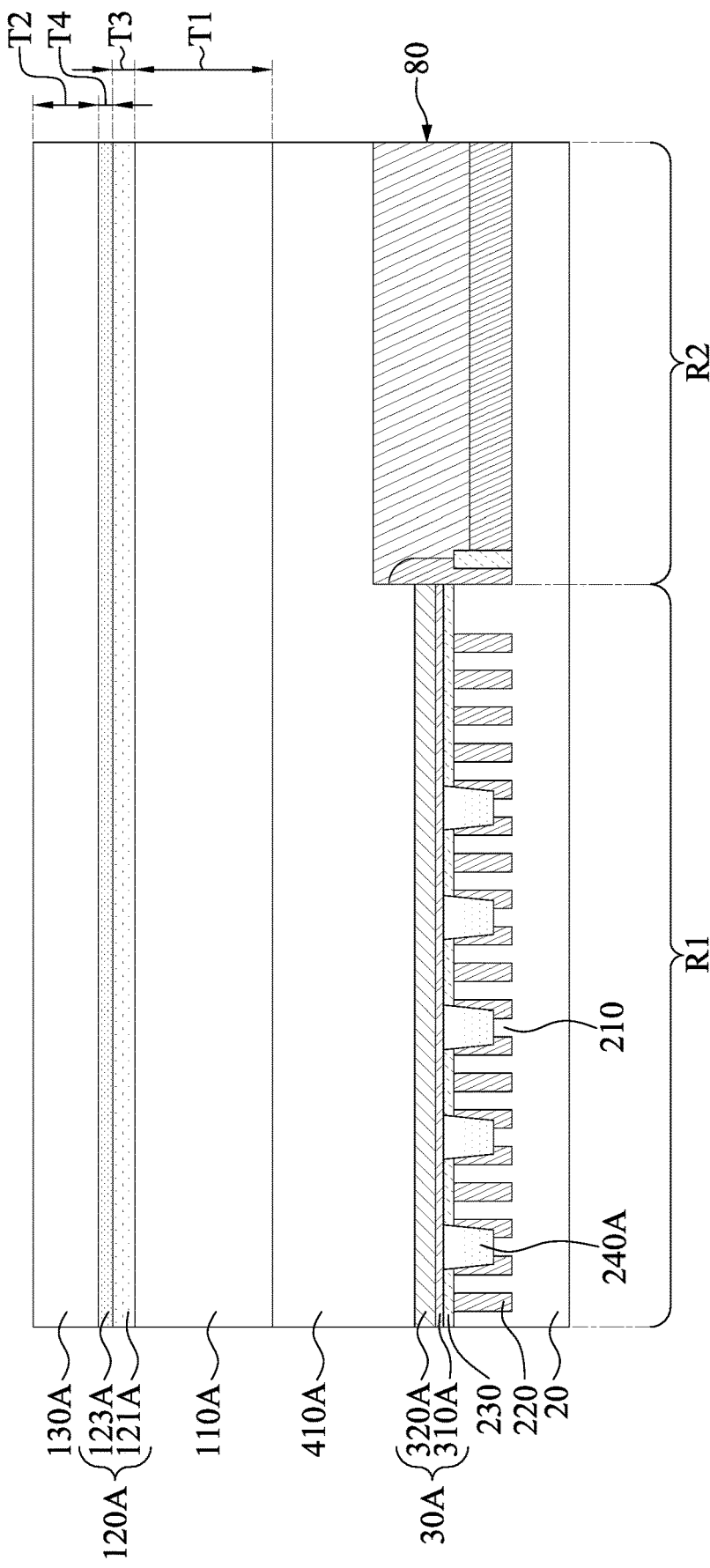
FIG. 2D illustrates one stage of a method for preparing a semiconductor structure, in accordance with some embodiments of the present disclosure.

Referring to FIG. 2D, which illustrates one stage of a method for preparing a semiconductor structure 1, in accordance with some embodiments of the present disclosure. An ashable hardmask layer 130A may be formed on the anti-reflection coating 120A.

In some embodiments, a processing temperature for forming the ashable hardmask layer 110A is higher than a processing temperature for forming the ashable hardmask layer 130A. In some embodiments, an implantation temperature for forming the ashable hardmask layer 110A is higher than an implantation temperature for forming the ashable hardmask layer 130A.

In some embodiments, an initial hardmask layer for the ashable hardmask layer 130A is formed on the anti-reflection coating 120A by a deposition process, e.g., a plasma-enhanced chemical vapor deposition (PECVD) process. In some embodiments, the anti-reflection coating 120A is exposed to a precursor gas including a $C_xH_y$-based gas, in which x is an integer of 2-6, y is an integer of 2-14, such as $C_2H_2$, $C_3H_6$, $C_4H_{10}$, $C_6H_6$, or a combination thereof. In some embodiments, the precursor gas is diluted by a bulk gas such as $N_2$, He, Ar, or a combination thereof. In some embodiments, the initial hardmask layer includes a carbon-based material, such as amorphous carbon.

In some embodiments, the initial hardmask layer for the ashable hardmask layer 130A is formed under a processing temperature (e.g., the deposition temperature) from about 400° C. to about 550° C. In some embodiments, the processing temperature of the initial hardmask layer is from about 450° C. to about 550° C. In some embodiments, the processing temperature of the initial hardmask layer is from about 500° C. to about 550° C. In some embodiments, the processing temperature of the initial hardmask layer is from about 530° C. to about 550° C.

Next, still referring to FIG. 2D, the initial mask layer for the ashable hardmask layer 130A is implanted with carbon atoms under an implantation temperature from about 400° C. to about 550° C. to form the ashable hardmask layer 130A. In some embodiments, the implantation temperature is from about 450° C. to about 550° C. In some embodiments, the implantation temperature is from about 500° C. to about 550° C. In some embodiments, the implantation temperature is from about 530° C. to about 550° C.

In some embodiments, the as-formed ashable hardmask layer 130A has a modulus that is less than the modulus of the ashable hardmask layer 110A. In some embodiments, the modulus of the ashable hardmask layer 130A is less than about 130 GPa.

In some embodiments, the ashable hardmask layer 130A has a tensile stress that is greater than a tensile stress of the ashable hardmask layer 110A. In some embodiments, the tensile stress of the ashable hardmask layer 130A is from about 75 GPa to about 231 GPa.

In some embodiments, the ashable hardmask layer 130A has a density that is smaller than a density of the ashable hardmask layer 110A. In some embodiments, the density of the ashable hardmask layer 130A is equal to or less than about 1.7 g/cm$^3$. In some embodiments, the density of the ashable hardmask layer 130A is from about 1.5 g/cm$^3$ to about 1.7 g/cm$^3$.

In some embodiments, the thickness T2 of the ashable hardmask layer 130A is less than the thickness T1 of the ashable hardmask layer 110A. In some embodiments, the thickness T2 of the ashable hardmask layer 130A is equal to or less than about 60 nm.

Table 1 shows comparison of etching properties of the ashable hardmask layers 110A and 130A. Table 1 shows the etching rates of the ashable hardmask layers 110A and 130A by using various etchants. "C-etchant" indicates an etchant having a relatively high etching rate for carbon-based materials, "N-etchant" indicates an etchant having a relatively high etching rate for nitride-based materials, "W-etchant" indicates an etchant having a relatively high etching rate for tungsten-based materials.

TABLE 1

| | Etching rate (Å/sec) | | |
| --- | --- | --- | --- |
| | C-etchant | N-etchant | W-etchant |
| ashable hardmask layers 110A | 185 | 128 | 21 |
| ashable hardmask layers 130A | 240 | 133 | 41 |

As shown in table 1, the ashable hardmask layer 110A have relatively slow etching rates against various etchants, while the ashable hardmask layer 130A have relatively fast etching rates against various etchants. Therefore, the results in table 1 show that the ashable hardmask layer 110A is less vulnerable to various etchants, particularly for nitride-based materials (e.g., the nitride layer 410A which will be illustrated hereinafter) and tungsten-based materials (e.g., the conductive sub-layer 320A which will be illustrated hereinafter). Therefore, the ashable hardmask layer 110A can provide a relatively high etching selectivity for nitride-based materials and tungsten-based materials.

Figure 2E:
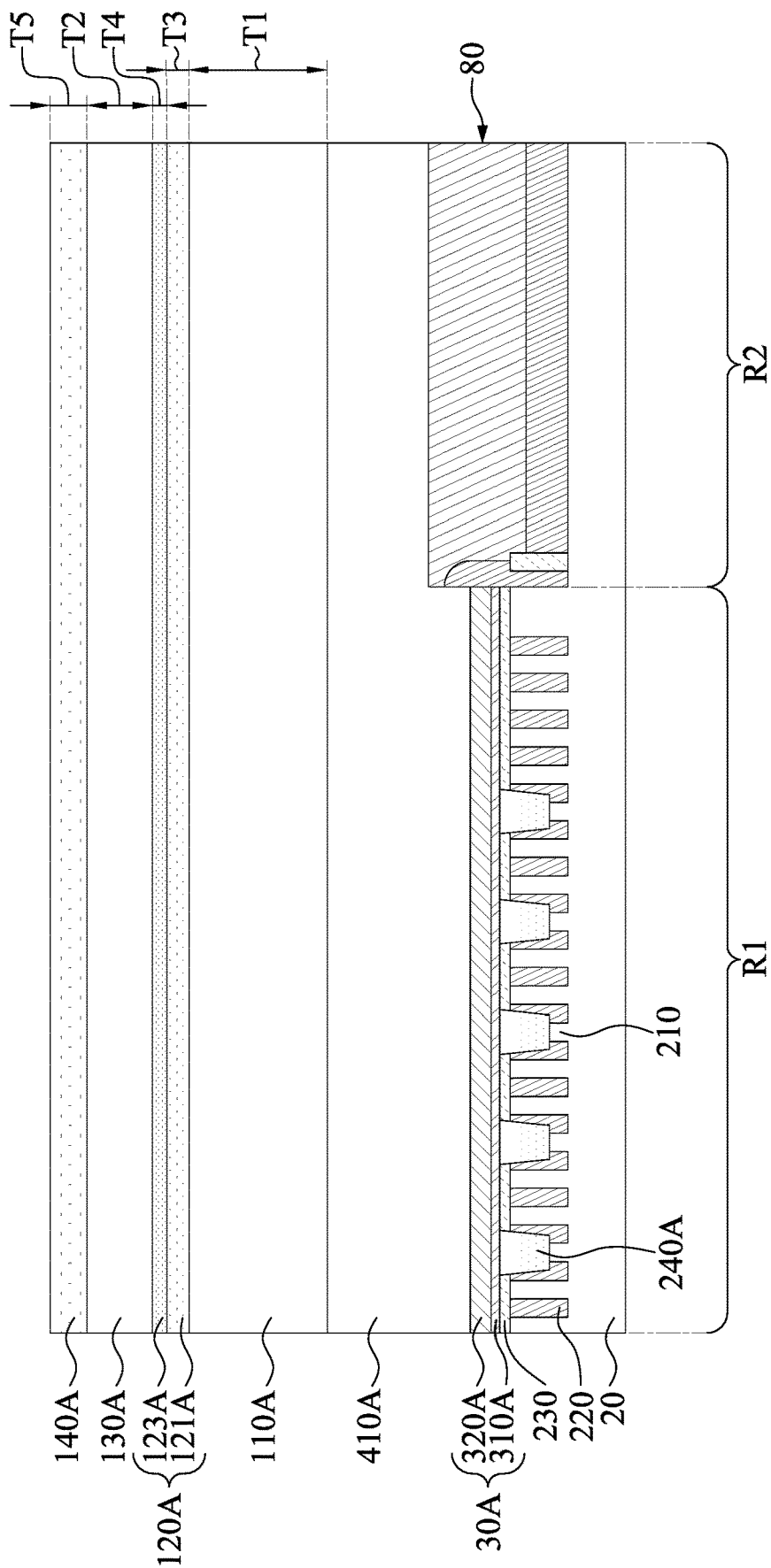
FIG. 2E illustrates one stage of a method for preparing a semiconductor structure, in accordance with some embodiments of the present disclosure.

Referring to FIG. 2E, which illustrates one stage of a method for preparing a semiconductor structure 1, in accordance with some embodiments of the present disclosure. An anti-reflection coating 140A may be formed on the ashable hardmask layer 130A.

In some embodiments, the anti-reflection coating 140A may be or include an oxygen-rich silicon oxynitride layer. For example, an atomic ratio of silicon to oxygen (Si/O) of the anti-reflection coating 140A may be less than 1.

In some embodiments, the anti-reflection coating 140A may be formed by a deposition process, e.g., a plasma-enhanced chemical vapor deposition (PECVD) process. In some embodiments, a thickness T5 of the anti-reflection coating 140A is less than a thickness of the anti-reflection coating 120A. In some embodiments, a thickness T5 of the anti-reflection coating 140A is less than a sum of the thickness T3 of the anti-reflection layer 121A and the thickness T4 of the anti-reflection layer 123A. In some embodiments, the thickness T5 of the anti-reflection coating 140A is from 20 nm to about 30 nm. In some embodiments, the thickness T5 of the anti-reflection coating 140A is about 25 nm.

Figure 2F:
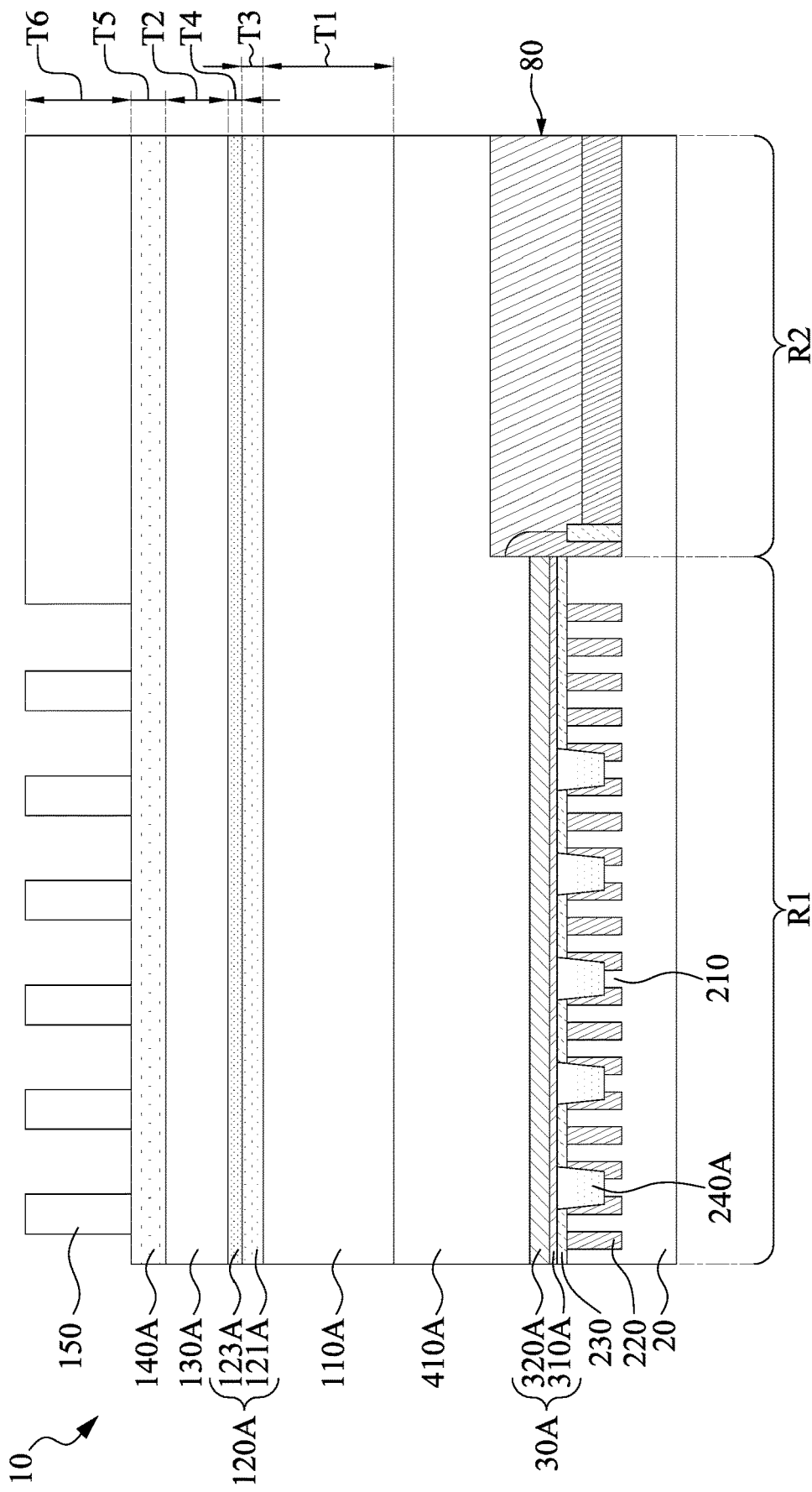
FIG. 2F illustrates one stage of a method for preparing a semiconductor structure, in accordance with some embodiments of the present disclosure.

Referring to FIG. 2F, which illustrates one stage of a method for preparing a semiconductor structure 1, in accordance with some embodiments of the present disclosure. A patterned photoresist layer 150 may be formed over the ashable hardmask layer 130A.

In some embodiments, a photoresist layer 150A is formed on the anti-reflection coating 140A, and thus the hardmask structure 10 illustrated in FIG. 1 is formed on the conductive layer 30A. The photoresist layer 150A may be or include a polymeric material. The photoresist layer 150A may be formed by coating, e.g., a spin-coating process.

In some embodiments, a photolithography process is performed on the photoresist layer 150A to form the patterned photoresist layer 150 on the anti-reflection coating 140A. In some embodiments, the photolithography process for forming the patterned photoresist layer 150 uses a radiation source of mercury vapor lamp, xenon lamp, carbon arc lamp, a KrF excimer laser light, an ArF excimer laser light, or an F$_2$ excimer laser light. In some embodiments, the patterned photoresist layer 150 has a pattern P1. In some embodiments, the pattern P1 of the patterned photoresist layer 150 is on the array region R1.

Figure 3:
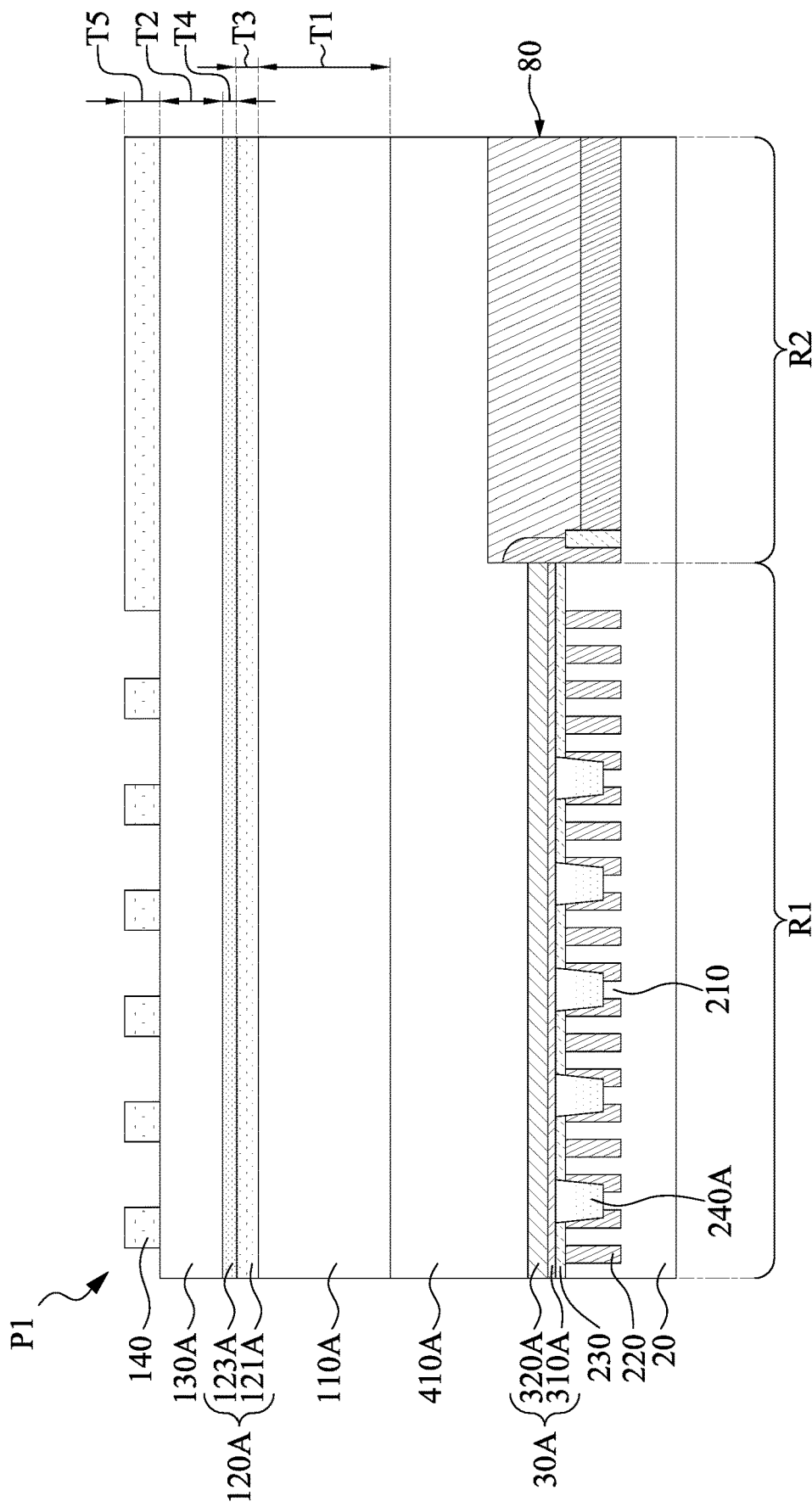
FIG. 3 illustrates one stage of a method for preparing a semiconductor structure, in accordance with some embodiments of the present disclosure.

Referring to FIG. 3, which illustrates one stage of a method for preparing a semiconductor structure 1, in accordance with some embodiments of the present disclosure. The pattern P1 may be transferred to the anti-reflection coating 140.

In some embodiments, the anti-reflection coating 140A is etched to form the anti-reflection coating 140 having the pattern P1. In some embodiments, the pattern P1 of the patterned photoresist layer 150 is transferred to the anti-reflection coating 140. In some embodiments, the anti-reflection coating 140A is etched using the patterned photoresist layer 150 as a mask. In some embodiments, the exposed portion of the anti-reflection coating 140A is etched by exposing the anti-reflection coating 140A to a halogen-containing etchant, such as Cl$_2$, BCl$_3$, CF$_4$, CHF$_3$, HBr, or a combination thereof. In some embodiments, the exposed portion of the anti-reflection coating 140A is etched by exposing the anti-reflection coating 140A to a halogen-containing etchant including CF$_4$ and HBr. In some embodiments, the anti-reflection coating 140A is etched by a plasma etching operation using CF$_4$ and HBr. In some embodiments, a portion of the ashable hardmask layer 130A is exposed from the anti-reflection coating 140.

Figure 4:
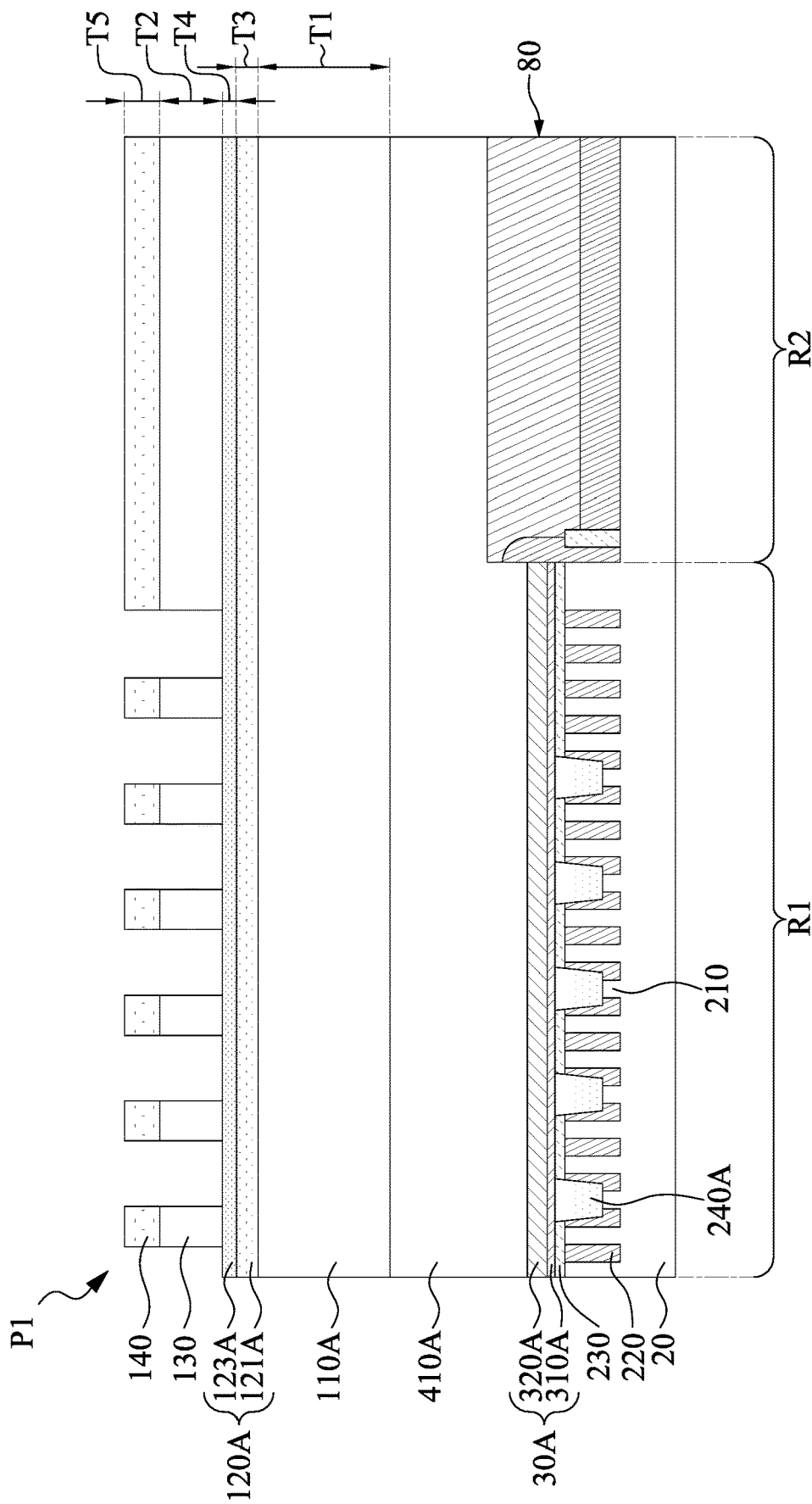
FIG. 4 illustrates one stage of a method for preparing a semiconductor structure, in accordance with some embodiments of the present disclosure.

Referring to FIG. 4, which illustrates one stage of a method for preparing a semiconductor structure 1, in accordance with some embodiments of the present disclosure. The pattern P1 may be transferred to the ashable hardmask layer 130.

In some embodiments, the ashable hardmask layer 130A is etched to form the ashable hardmask layer 130 having the pattern P1. In some embodiments, the pattern P1 of the anti-reflection coating 140 is transferred to the ashable hardmask layer 130. In some embodiments, the ashable hardmask layer 130A is etched using the anti-reflection coating 140 as a mask. In some embodiments, the exposed portion of the ashable hardmask layer 130A is etched by exposing the ashable hardmask layer 130A to $O_2$ and $SO_2$. In some embodiments, the ashable hardmask layer 130A is etched by a plasma etching operation using $O_2$ and $SO_2$. In some embodiments, a portion of the anti-reflection coating 120A is exposed from the ashable hardmask layer 130. In some embodiments, a portion of the anti-reflection layer 123A is exposed from the ashable hardmask layer 130.

Figure 5:
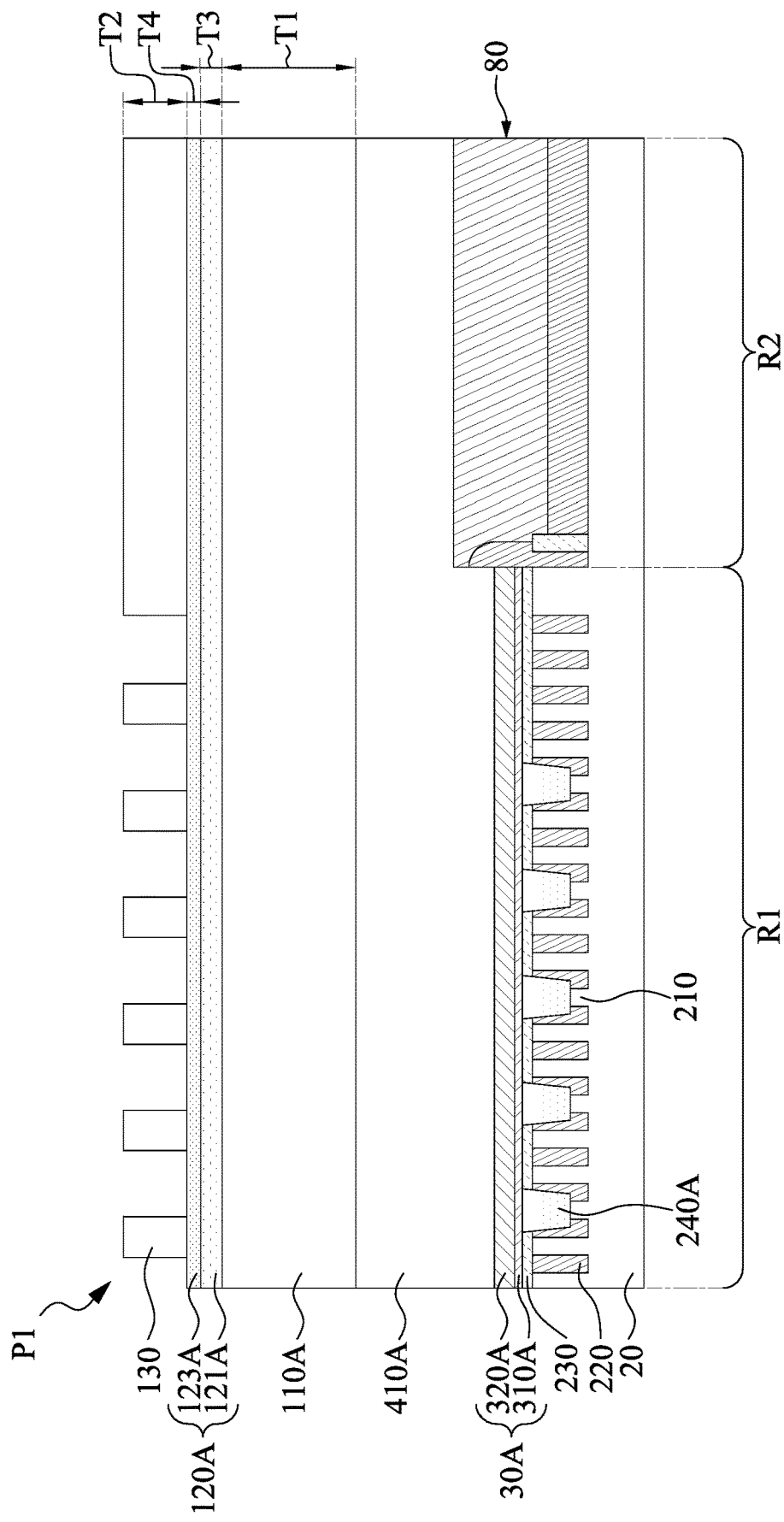
FIG. 5 illustrates one stage of a method for preparing a semiconductor structure, in accordance with some embodiments of the present disclosure.

Referring to FIG. 5, which illustrates one stage of a method for preparing a semiconductor structure 1, in accordance with some embodiments of the present disclosure. The anti-reflection coating 140 is removed.

In some embodiments, an etching operation may be used to remove the anti-reflection coating 140. For example, a wet etching operation using diluted HF may be used to remove the anti-reflection coating 140.

Figure 6:
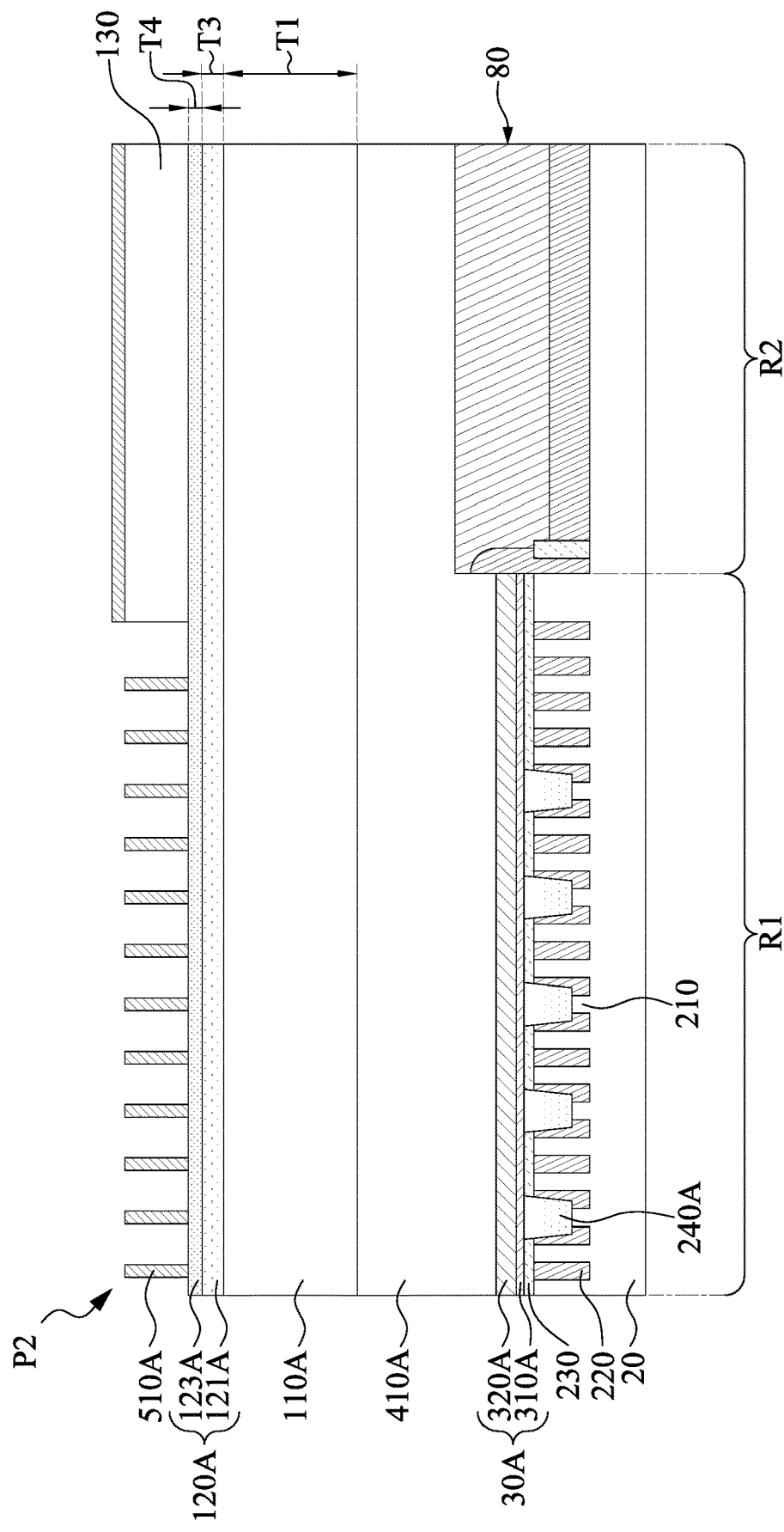
FIG. 6 illustrates one stage of a method for preparing a semiconductor structure, in accordance with some embodiments of the present disclosure.

Referring to FIG. 6, which illustrates one stage of a method for preparing a semiconductor structure 1, in accordance with some embodiments of the present disclosure. A sacrificial layer 510A having a pattern P2 (also referred to as "a predetermined pattern") may be disposed over the conductive layer 30A.

In some embodiments, a sacrificial layer may be formed on top surfaces and sidewalls of the ashable hardmask layer 130 and on the exposed portion of the anti-reflection layer 123A. In some embodiments, a portion of the ashable hardmask layer 130 on the array region R1 may be removed, and the portions of the sacrificial layer on the top surfaces of the ashable hardmask layer 130 and on the exposed portion of the anti-reflection layer 123A may be removed along with the removal of the ashable hardmask layer 130. As a result, portions of the sacrificial layer on the sidewalls of the ashable hardmask layer 130 are left on the anti-reflection layer 123A on the array region R1.

In some embodiments, after the ashable hardmask layer 130 is removed, the portions of the sacrificial layer remained on the anti-reflection layer 123A on the array region R1 form the sacrificial layer 510A having the pattern P2. In some embodiments, a portion of the ashable hardmask layer 130 on the peripheral region R2 remains. The sacrificial layer 510A may include silicon oxide.

In some embodiments, a pitch of the pattern P1 is greater than a pitch of the pattern P2. In some embodiments, a pitch of the pattern P1 is about twice a pitch of the pattern P2.

Figure 7:
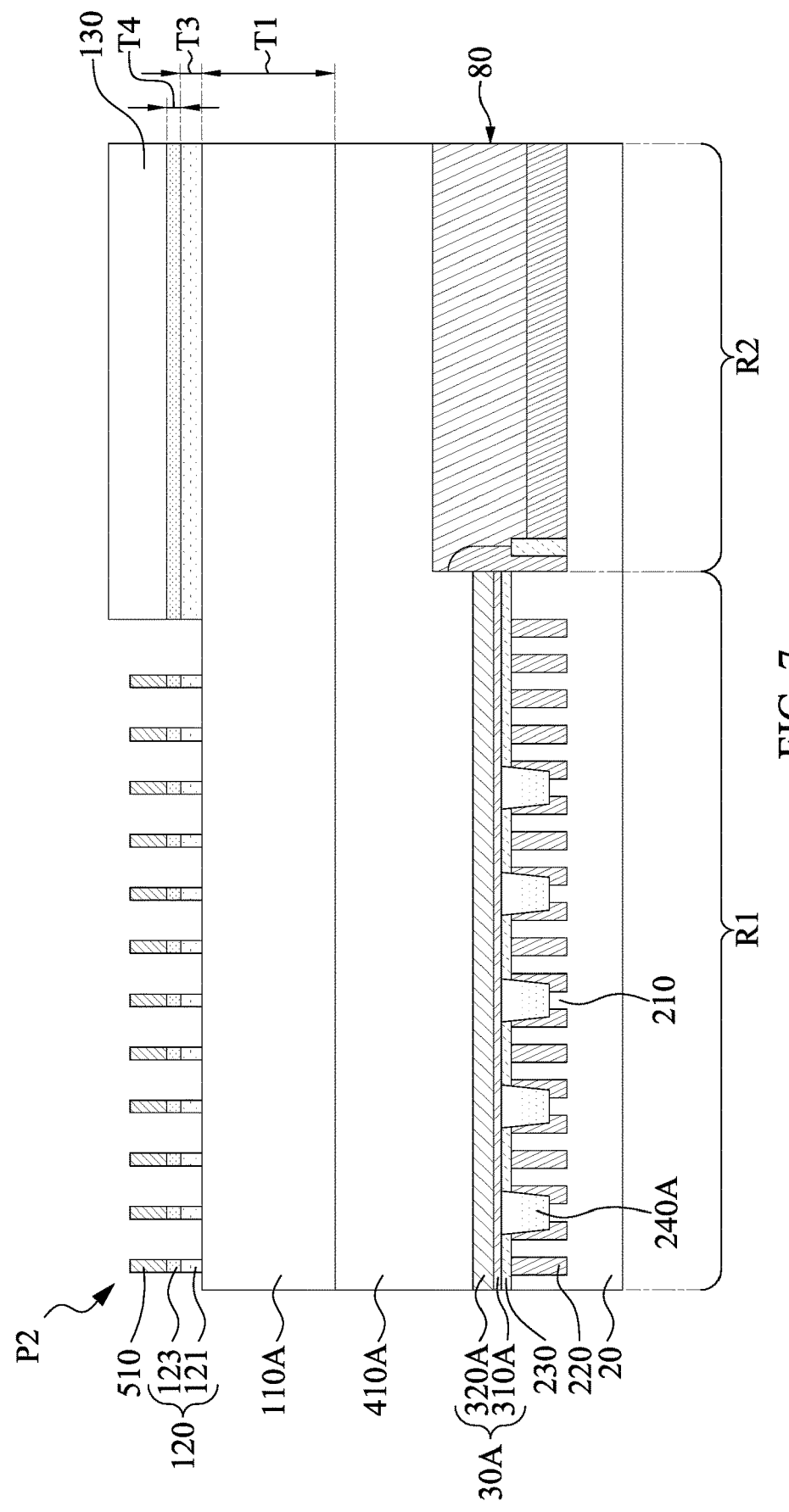
FIG. 7 illustrates one stage of a method for preparing a semiconductor structure, in accordance with some embodiments of the present disclosure.

Referring to FIG. 7, which illustrates one stage of a method for preparing a semiconductor structure 1, in accordance with some embodiments of the present disclosure. The pattern P2 may be transferred to the anti-reflection coating 120A.

In some embodiments, the pattern P2 is transferred to the anti-reflection layer 121A and the anti-reflection layer 123A. In some embodiments, the anti-reflection coating 120A is etched to form the anti-reflection coating 120 having the pattern P2. In some embodiments, the pattern P2 of the sacrificial layer 510A is transferred to the anti-reflection coating 120. In some embodiments, the anti-reflection coating 120A is etched using the sacrificial layer 510A as a mask.

In some embodiments, the exposed portion of the anti-reflection coating 120A is etched by exposing the anti-reflection coating 120A to a halogen-containing etchant, such as $Cl_2$, $BCl_3$, $CF_4$, $CHF_3$, HBr, or a combination thereof. In some embodiments, the exposed portion of the anti-reflection coating 120A is etched by exposing the anti-reflection coating 120A to a halogen-containing etchant including $CF_4$ and HBr. In some embodiments, the anti-reflection coating 120A is etched by a plasma etching operation using $CF_4$ and HBr. In some embodiments, a portion of the ashable hardmask layer 110A is exposed from the anti-reflection coating 120.

In some embodiments, the exposed portion of the anti-reflection layer 123A is etched by exposing the anti-reflection layer 123A to a halogen-containing etchant including $CF_4$ and HBr, and then a portion of the anti-reflection layer 121A is exposed from the anti-reflection layer 123A. In some embodiments, the exposed portion of the anti-reflection layer 121A is then etched by exposing the anti-reflection layer 121A to the halogen-containing etchant including $CF_4$ and HBr. The anti-reflection layers 121A and 123A may be etched by the same etching operation. In some embodiments, a portion of the ashable hardmask layer 110A is exposed from the anti-reflection layers 121 and 123.

In some embodiments, after the anti-reflection layers 121A and 123A are etched, portions of the sacrificial layer 510A are removed to form the sacrificial layer 510. In some embodiments, portions of the sacrificial layer 510A are removed to expose the remained portion of the ashable hardmask layer 130.

Referring to FIG. 8, which illustrates one stage of a method for preparing a semiconductor structure 1, in accordance with some embodiments of the present disclosure. The pattern P2 may be transferred to the ashable hardmask layer 110.

In some embodiments, the ashable hardmask layer 110A is etched to form the ashable hardmask layer 110 having the pattern P2. In some embodiments, the pattern P2 of the anti-reflection coating 120 is transferred to the ashable hardmask layer 110. In some embodiments, the ashable hardmask layer 110A is etched using the anti-reflection coating 120 as a mask. In some embodiments, the exposed portion of the ashable hardmask layer 110A is etched by exposing the ashable hardmask layer 110A to $O_2$ and $SO_2$. In some embodiments, the ashable hardmask layer 110A is etched by a plasma etching operation using $O_2$ and $SO_2$. In some embodiments, a portion of the nitride layer 410A is exposed from the ashable hardmask layer 110.

In some embodiments, a pitch of the pattern P1 of the ashable hardmask layer 130 is greater than a pitch of the pattern P2 of the ashable hardmask layer 110. In some embodiments, a pitch of the pattern P1 of the ashable hardmask layer 130 is about twice a pitch of the pattern P2 of the ashable hardmask layer 110.

In some embodiments, the remained portion of the ashable hardmask layer 130 on the peripheral region R2 may be removed. In some embodiments, the remained portion of the ashable hardmask layer 130 may be removed by stripping, e.g., using $O_2$ plasma.

FIG. 9 illustrates one stage of a method for preparing a semiconductor structure 1, in accordance with some embodiments of the present disclosure. The pattern P2 may be transferred to the nitride layer 410A.

In some embodiments, the anti-reflection coating 120 is removed from the ashable hardmask layer 110. For example, a wet etching operation using diluted HF may be used to remove the anti-reflection coating 120.

In some embodiments, the anti-reflection layer 121A includes an oxygen-rich silicon oxynitride layer, and the anti-reflection layer 123A includes a silicon-rich silicon oxynitride layer. In some embodiments, the silicon-rich silicon oxynitride layer (i.e., the anti-reflection layer 123A) having a relatively high hardness can further increase the etching selectivity and provide a uniform etching effect. In some embodiments, the oxygen-rich silicon oxynitride layer (i.e., the anti-reflection layer 123A) may be removed more easily, e.g., by HF or diluted HF, and thus the silicon-rich silicon oxynitride layer may be easily removed along with the removal of the oxygen-rich silicon oxynitride layer, which may simplify the manufacturing process.

In some embodiments, the nitride layer 410A is etched to form the nitride layer 410 having the pattern P2. In some embodiments, the pattern P2 of the ashable hardmask layer 110 is transferred to the nitride layer 410. In some embodiments, the nitride layer 410A is etched using the ashable hardmask layer 110 as a mask. In some embodiments, the exposed portion of the nitride layer 410A is etched by exposing the nitride layer 410A to a suitable etchant. In some embodiments, the nitride layer 410A is etched by a plasma etching operation. In some embodiments, a portion of the conductive layer 30A is exposed from the nitride layer 410.

In some embodiments, the ashable hardmask layer 110A has a relative large thickness T1, and thus a desired relatively large aspect ratio and a desired relatively small line width/line spacing of the nitride layer 410 can be achieved, while the ashable hardmask layer 110A can be prevented from being completely consumed in the etching operation for the nitride layer 410.

FIG. 10 illustrates one stage of a method for preparing a semiconductor structure 1, in accordance with some embodiments of the present disclosure. The pattern P2 may be transferred to the patterned conductive layer 30.

In some embodiments, a portion of the conductive layer 30A is removed according to the hardmask structure (e.g., the ashable hardmask layer 110, which transfers the pattern P2 to the nitride layer 410) to form the patterned conductive layer 30 having the pattern P2. In some embodiments, the conductive layer 30A is etched according to the nitride layer 410 to form the patterned conductive layer 30 having the pattern P2.

In some embodiments, the pattern P2 is transferred to the patterned conductive sub-layer 310 and the patterned conductive sub-layer 320. In some embodiments, the conductive layer 30A is etched to form the patterned conductive layer 30 having the pattern P2 (or the predetermined pattern). In some embodiments, the pattern P2 of the nitride layer 410 is transferred to the patterned conductive layer 30. In some embodiments, the conductive layer 30A is etched using the nitride layer 410 as a mask. In some embodiments, the exposed portion of the conductive layer 30A is etched by exposing the conductive layer 30A to a halogen-containing etchant, such as $Cl_2$, $BCl_3$, $CF_4$, $CHF_3$, or a combination thereof. In some embodiments, the conductive layer 30A is etched by a plasma etching operation. In some embodiments, a portion of the buffer layer 230 is exposed from the patterned conductive layer 30. In some embodiments, the patterned conductive layer 30 in the array region R1 may serve as bit lines.

In some embodiments, the exposed portion of the conductive sub-layer 320A is etched by using the nitride layer 410 as a mask and exposing the conductive sub-layer 320A to a suitable etchant, and then a portion of the conductive sub-layer 310A is exposed from the conductive sub-layer 320A. In some embodiments, the exposed portion of the conductive sub-layer 310A is then etched by exposing the conductive sub-layer 310A to a suitable etchant. The conductive sub-layers 310A and 320A may be etched by the same etching operation. In some embodiments, a portion of the buffer layer 230 is exposed from the patterned conductive sub-layers 310 and 320.

In some embodiments, the conductive portions 240A are etched according to the ashable hardmask layer 110 to form a plurality of conductive contacts 240. In some embodiments, the conductive portions 240A are etched by using the nitride layer 410 as a mask and exposing the conductive portions 240A to a suitable etchant. The conductive portions 240 may have tapered shapes. In some embodiments, the conductive portions 240 in the array region R1 may serve as bit line contacts. As such, the semiconductor structure 1 is formed. In some embodiments, the semiconductor structure 1 may be an intermediate structure for forming a semiconductor device, e.g., a memory device.

According to some embodiments of the present disclosure, the ashable hardmask layer 110 (or the bottom ashable hardmask layer) of the hardmask structure 10 has the aforesaid relatively high modulus can provide an excellent etching selectivity in the etching operation of the nitride layer 410 and the conductive layer 30A underneath, and thus the pattern P2 (or the predetermined pattern) can be transferred to the patterned conductive layer 30 more accurately and precisely. In addition, according to some embodiments of the present disclosure, the ashable hardmask layer 110A having the aforesaid relatively low compressive stress can further reduce wiggling issues of the patterned conductive layer 30. Moreover, according to some embodiments of the present disclosure, the patterned conductive layer 30 may serve as bit lines. With the line bending and/or wiggling issues of the bit lines are mitigated or prevented, the shapes and locations of the bit lines can be more accurate and precise, contact area between bit lines and adjacent contact structures can be increased, the resistance can be reduced, the signal transmission rate can be increased, and the electrical performance of the semiconductor device incorporating the semiconductor structure 1 can be improved.

One aspect of the present disclosure provides a hardmask structure. The hardmask structure includes a first ashable hardmask layer, a first anti-reflection coating, and a second ashable hardmask layer. The first anti-reflection coating is disposed on the first ashable hardmask layer. The second ashable hardmask layer is disposed on the first anti-reflection coating. A modulus of the first ashable hardmask layer is greater than a modulus of the second ashable hardmask layer.

Another aspect of the present disclosure provides a method for preparing a semiconductor structure. The method includes forming a conductive layer on a substrate and forming a first ashable hardmask layer on the conductive layer. The method also includes forming a first anti-reflection coating on the first ashable hardmask layer and forming a second ashable hardmask layer on the first anti-reflection coating, wherein a modulus of the first ashable hardmask layer is greater than a modulus of the second ashable hardmask layer. The method further includes etching the first ashable hardmask layer, the first anti-reflection coating, and the second ashable hardmask layer to transfer a first pattern to at least the first ashable hardmask layer. The method further includes etching the conductive layer according to the first ashable hardmask layer to form a patterned conductive layer.

Another aspect of the present disclosure provides a method for preparing a semiconductor structure. The method includes forming a conductive layer on a substrate and forming a hardmask structure on the conductive layer. The operation for forming the hardmask structure includes forming a first ashable hardmask layer on the conductive layer, the first ashable hardmask layer having a modulus of greater than about 130 GPa. The operation for forming the hardmask structure further includes forming a first anti-reflection coating on the first ashable hardmask layer. The method further includes removing a portion of the conductive layer according to the hardmask structure to form a patterned conductive layer.

The bottom ashable hardmask layer of the hardmask structure has a relatively high modulus can provide an excellent etching selectivity in the etching operation of a conductive layer underneath, and thus a predetermined pattern can be transferred to the patterned conductive layer more accurately and precisely. In addition, the bottom ashable hardmask layer having a relatively low compressive stress can further reduce wiggling issues of the patterned conductive layer. Moreover, the patterned conductive layer may serve as bit lines. With the line bending and/or wiggling issues of the bit lines are mitigated or prevented, the shapes and locations of the bit lines can be more accurate and precise, contact area between bit lines and adjacent contact structures can be increased, the resistance can be reduced, the signal transmission rate can be increased, and the electrical performance can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor structure, comprising:
   forming a conductive layer on a buffer layer of a substrate, wherein the buffer layer has a plurality of spaced apart openings;
   forming a plurality of conductive portions in the openings of the buffer layer respectively, wherein a bottom surface of the conductive layer is in contact with top surfaces of the buffer layer and the conductive portions;
   forming a nitride layer on the conductive layer at a position that a bottom surface of the nitride layer is in contact with a top surface of the conductive layer;
   forming a first ashable hardmask layer on the nitride layer at a position that a bottom surface of the first ashable hardmask is in contact with a top surface of the nitride layer, such that the nitride layer is sandwiched between the conductive layer and the first ashable hardmask;
   forming a first anti-reflection coating on the first ashable hardmask layer;
   forming a second ashable hardmask layer on the first anti-reflection coating at a position that a bottom surface of the second ashable hardmask is in contact with a top surface of the first anti-reflection coating, wherein a modulus of the first ashable hardmask layer is greater than a modulus of the second ashable hardmask layer, wherein a tensile stress of the first ashable hardmask layer is smaller than a tensile stress of the second ashable hardmask, wherein an etching rate of the first ashable hardmask layer is slower than an etching rate of the second ashable hardmask;
   etching the first ashable hardmask layer, the first anti-reflection coating, and the second ashable hardmask layer to transfer a first pattern to at least the first ashable hardmask layer, wherein the first pattern is extended from and cover on a portion the top surface of the nitride layer so as to expose uncovered portion of the top surface of the nitride layer, wherein the first pattern is configured to have a bottom portion upwardly extended from the nitride layer and a top portion upwardly extended from the bottom portion, wherein the bottom portion and the top portion of the first pattern are transferred from the first ashable hardmask layer and the first anti-reflection coating;
   etching the nitride layer using the first ashable hardmask layer having the first pattern as a mask to form a plurality of patterned nitride layers;
   etching the conductive layer according to the first ashable hardmask layer to form a patterned conductive layer, wherein a portion of the buffer layer and a portion of the conductive portion are exposed from the patterned conductive layer; and
   etching the conductive portions by using the patterned nitride layers to form a plurality of conductive contacts within the openings, wherein the conductive contacts are downwardly extended and aligned with the patterned nitride layers respectively;
   wherein each of the conductive contacts has a tapered shape that a width of the conductive contact is gradually increased from a bottom surface of the conductive layer toward the substrate;
   wherein the buffer layer is unetched and a thickness of the buffer layer remains unchanged, such that a top surfaces of the conductive contacts are coplanar with the top surface of the buffer layer.

2. The method of claim 1, wherein forming the first anti-reflection coating comprises:
   forming a first anti-reflection layer on the first ashable hardmask layer; and
   forming a second anti-reflection layer on the first anti-reflection layer, wherein the first anti-reflection layer and the second anti-reflection layer comprise an inorganic material and have different silicon to oxygen (Si/O) ratios.

3. The method of claim 2, wherein a sum of a thickness of the first anti-reflection layer and a thickness of the second anti-reflection layer is equal to or less than about 40 nm.

4. The method of claim 2, wherein etching the first anti-reflection coating comprises:
   etching the first anti-reflection layer and the second anti-reflection layer using a halogen-containing etchant.

5. The method of claim 1, wherein etching the second ashable hardmask layer comprises:

transferring a second pattern to the second ashable hardmask layer, wherein a pitch of the second pattern of the second ashable hardmask layer is greater than a pitch of the first pattern of the first ashable hardmask layer.

6. The method of claim 5, further comprising:
forming a second anti-reflection coating on the second ashable hardmask layer, the second anti-reflection coating having the second pattern, wherein a thickness of the second anti-reflection coating is less than a thickness of the first anti-reflection coating; and
etching the second ashable hardmask layer using the second anti-reflection coating as a mask.

7. The method of claim 5, further comprising:
forming a patterned photoresist layer on the second ashable hardmask layer, the patterned photoresist layer having the second pattern; and
etching the second anti-reflection coating using the patterned photoresist layer as a mask.

8. The method of claim 1, wherein each of the conductive portions has a tapered shape that a width of the conductive portion is gradually reduced from the bottom surface of the conductive layer toward the substrate before the conductive portion is etched to form the conductive contact.

9. The method of claim 8, wherein the top surface of the buffer layer is coplanar with a top surface of the conductive portion.

10. The method of claim 1, wherein the thickness of the buffer layer is smaller than a height of the conductive portion.

11. A method for preparing a semiconductor structure, comprising:
forming a conductive layer on a substrate, wherein the conductive layer comprises a first conductive sub-layer on the substrate and a second conductive sub-layer on the first conductive sub-layer, wherein the first conductive sub-layer is made of polysilicon or titanium, and the second conductive sub-layer is made of copper, nickel, cobalt, aluminum, or tungsten;
forming a hardmask structure on the conductive layer, comprising:
forming a first ashable hardmask layer on the conductive layer, the first ashable hardmask layer having a modulus of greater than about 130 GPa; and
forming a first anti-reflection coating on the first ashable hardmask layer;
etching the first ashable hardmask layer and the first anti-reflection coating to form a first pattern, wherein the first pattern is configured to have a bottom portion and a top portion being transferred from the first ashable hardmask layer and the first anti-reflection coating respectively; and
removing a portion of the conductive layer according to the hardmask structure to form a patterned conductive layer by:
firstly etching portions of the second conductive sub-layer of the conductive layer being exposed from the first ashable hardmask layer to form a plurality of patterned second conductive sub-layers, such that a portion of the first conductive sub-layer of the conductive layer being is exposed from the patterned second conductive sub-layers; and
sequentially etching the portion of the first conductive sub-layer of the conductive layer being exposed from the patterned second conductive sub-layers to form a plurality of patterned first conductive sub-layers.

12. The method of claim 11, wherein forming the hardmask structure further comprises:
forming a second ashable hardmask layer on the first anti-reflection coating, wherein a modulus of the first ashable hardmask layer is greater than a modulus of the second ashable hardmask layer, wherein an etching rate of the first ashable hardmask layer is slower than an etching rate of the second ashable hardmask.

13. The method of claim 12, wherein a processing temperature for forming the first ashable hardmask layer is higher than a processing temperature for forming the second ashable hardmask layer.

14. The method of claim 12, wherein forming the hardmask structure further comprises:
forming a second anti-reflection coating on the second ashable hardmask layer.

15. The method of claim 12, wherein forming the hardmask structure further comprises:
forming a patterned photoresist layer on the second ashable hardmask layer.

16. The method of claim 12, wherein a thickness of the first ashable hardmask layer is greater than a thickness of the second ashable hardmask layer, wherein a tensile stress of the first ashable hardmask layer is smaller than a tensile stress of the second ashable hardmask, wherein a density of the first ashable hardmask layer is greater than a density of the second ashable hardmask layer.

17. The method of claim 11, wherein forming the first anti-reflection coating comprises:
forming an oxygen-rich silicon oxynitride layer on the first ashable hardmask layer; and
forming a silicon-rich silicon oxynitride layer on the oxygen-rich silicon oxynitride layer.

18. The method of claim 17, wherein a thickness of the silicon-rich silicon oxynitride layer is less than a thickness of the oxygen-rich silicon oxynitride layer.

19. The method of claim 11, wherein the hardmask structure is free of an amorphous silicon layer, wherein a thickness of the second conductive sub-layer is larger than a thickness of the first conductive sub-layer.

20. The method of claim 11, wherein the first ashable hardmask layer has a modulus from about 140 GPa to about 170 GPa, and has a compressive stress from about −80 MPa to about 50 MPa.

* * * * *